(12) United States Patent
Jiang et al.

(10) Patent No.: US 10,976,009 B2
(45) Date of Patent: *Apr. 13, 2021

(54) LED FILAMENT LIGHT BULB

(71) Applicant: ZHEJIANG SUPER LIGHTING ELECTRIC APPLIANCE CO.,LTD, Zhejiang (CN)

(72) Inventors: Tao Jiang, Zhejiang (CN); Wei-Hong Xu, Zhejiang (CN); Yukihiro Saito, Zhejiang (CN); Hayato Unagiike, Zhejiang (CN); Ai-Ming Xiong, Zhejiang (CN); Jun-Feng Xu, Zhejiang (CN); Yi-Ching Chen, Zhejiang (CN)

(73) Assignee: ZHEJIANG SUPER LIGHTING ELECTRIC APPLIANCE CO., LTD, Jinyun (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/290,951

(22) Filed: Mar. 3, 2019

(65) Prior Publication Data

US 2019/0195434 A1   Jun. 27, 2019

Related U.S. Application Data

(63) Continuation of application No. 16/234,124, filed on Dec. 27, 2018, now Pat. No. 10,845,008, which is a
(Continued)

(30) Foreign Application Priority Data

Sep. 28, 2014 (CN) .......................... 201410510593.6
Feb. 2, 2015 (CN) .......................... 201510053077.X
(Continued)

(51) Int. Cl.
*F21K 9/61* (2016.01)
*F21K 9/232* (2016.01)
*F21V 15/04* (2006.01)
*H05B 33/08* (2020.01)
*H05B 45/00* (2020.01)
*F21Y 115/10* (2016.01)

(52) U.S. Cl.
CPC ............... *F21K 9/232* (2016.08); *F21K 9/61* (2016.08); *F21V 15/04* (2013.01); *H05B 45/00* (2020.01); *F21Y 2115/10* (2016.08)

(58) Field of Classification Search
CPC . F21K 9/61; F21K 9/232; F21V 15/04; F21Y 2115/10; H05B 33/0806
See application file for complete search history.

(56) References Cited

U.S. PATENT DOCUMENTS 8,455,895 B2   6/2013   Chai et al.
8,933,619 B1   1/2015   Ou
(Continued)

FOREIGN PATENT DOCUMENTS

CN   202252991 U   5/2012
CN   102751274 A   10/2012
(Continued)

*Primary Examiner* — Bijan Ahvazi
(74) *Attorney, Agent, or Firm* — Simon Kuang Lu

(57) ABSTRACT

An LED filament light bulb, comprising: a lamp housing with inner surface and outer surface opposite to the inner surface of the lamp housing, the lamp housing includes a layer of luminescent material, which is formed on the inner surface or the outer surface of the lamp housing or integrated in the material of the lamp housing; a bulb base connected to the lamp housing; a stem connected to the bulb base and located in the lamp housing; and a single filament, disposed in the light housing, the LED filament comprising: a plurality of LED filament units, wherein each of the plurality of LED filament units includes a single LED chip with an upper surface and a lower surface opposite to the upper surface. The LED filament light bulb further comprising a plurality of supporting arms, connected with and supporting the LED filament, wherein the stem comprises a stand extending to the center of the lamp housing, the stand supports the supporting arms.

20 Claims, 5 Drawing Sheets

Related U.S. Application Data continuation-in-part of application No. 15/858,036, filed on Dec. 29, 2017, now Pat. No. 10,544,905, which is a continuation-in-part of application No. 29/627,379, filed on Nov. 27, 2017, now Pat. No. Des. 879,330, and a continuation-in-part of application No. 29/619,287, filed on Sep. 28, 2017, now Pat. No. Des. 862,740, and a continuation-in-part of application No. 15/723,297, filed on Oct. 3, 2017, now Pat. No. 10,655,792, which is a continuation-in-part of application No. 15/168,541, filed on May 31, 2016, now Pat. No. 9,995,474, and a continuation-in-part of application No. 15/499,143, filed on Apr. 27, 2017, now Pat. No. 10,240,724, and a continuation-in-part of application No. 15/308,995, filed as application No. PCT/CN2015/090815 on Sep. 25, 2015, now Pat. No. 10,781,979, said application No. 15/499,143 is a continuation-in-part of application No. 15/384,311, filed on Dec. 19, 2016, now Pat. No. 10,487,987, which is a continuation-in-part of application No. 15/366,535, filed on Dec. 1, 2016, now Pat. No. 10,473,271, which is a continuation-in-part of application No. 15/237,983, filed on Aug. 16, 2016, now Pat. No. 10,228,093.

(30) Foreign Application Priority Data

| Date | | Number |
|---|---|---|
| Jun. 10, 2015 | (CN) | 201510316656.9 |
| Jun. 19, 2015 | (CN) | 201510347410.8 |
| Aug. 7, 2015 | (CN) | 201510489363.0 |
| Aug. 17, 2015 | (CN) | 201510502630.3 |
| Sep. 2, 2015 | (CN) | 201510555889.4 |
| Dec. 19, 2015 | (CN) | 201510966906.3 |
| Jan. 22, 2016 | (CN) | 201610041667.5 |
| Apr. 27, 2016 | (CN) | 201610272153.0 |
| Apr. 29, 2016 | (CN) | 201610281600.9 |
| Jun. 3, 2016 | (CN) | 201610394610.3 |
| Jul. 7, 2016 | (CN) | 201610544049.2 |
| Jul. 22, 2016 | (CN) | 201610586388.7 |
| Nov. 1, 2016 | (CN) | 201610936171.4 |
| Dec. 6, 2016 | (CN) | 201611108722.4 |
| Jan. 13, 2017 | (CN) | 201710024877.8 |
| Feb. 14, 2017 | (CN) | 201710079423.0 |
| Mar. 9, 2017 | (CN) | 201710138009.2 |
| Mar. 23, 2017 | (CN) | 201710180574.5 |
| Apr. 11, 2017 | (CN) | 201710234618.8 |
| May 8, 2017 | (CN) | 201710316641.1 |
| Sep. 18, 2017 | (CN) | 201710839083.7 |
| Sep. 21, 2017 | (CN) | 201730450712.8 |
| Sep. 22, 2017 | (CN) | 201730453237.X |
| Sep. 22, 2017 | (CN) | 201730453239.9 |
| Sep. 26, 2017 | (CN) | 201710883625.0 |
| Oct. 16, 2017 | (CN) | 201730489929.X |
| Oct. 27, 2017 | (CN) | 201730517887.6 |
| Oct. 30, 2017 | (CN) | 201730520672.X |
| Nov. 3, 2017 | (CN) | 201730537542.7 |
| Nov. 3, 2017 | (CN) | 201730537544.6 |
| Dec. 26, 2017 | (CN) | 201711434993.3 |
| Dec. 29, 2017 | (CN) | 201711477767.3 |
| Jan. 12, 2018 | (CN) | 201810031786.1 |
| Jan. 23, 2018 | (CN) | 201810065369.9 |
| Apr. 17, 2018 | (CN) | 201810343825.1 |
| Apr. 17, 2018 | (CN) | 201810344630.9 |
| May 23, 2018 | (CN) | 201810498980.0 |
| May 23, 2018 | (CN) | 201810501350.4 |
| Jun. 6, 2018 | (CN) | 201810573314.9 |
| Jul. 26, 2018 | (CN) | 201810836433.9 |
| Aug. 17, 2018 | (CN) | 201810943054.X |
| Aug. 30, 2018 | (CN) | 201811005145.5 |
| Aug. 30, 2018 | (CN) | 201811005536.7 |
| Sep. 17, 2018 | (CN) | 201811079889.1 |
| Oct. 30, 2018 | (CN) | 201811277980.4 |
| Oct. 31, 2018 | (CN) | 201811285657.1 |
| Nov. 19, 2018 | (CN) | 201811378173.1 |
| Nov. 19, 2018 | (CN) | 201811378189.2 |
| Dec. 18, 2018 | (CN) | 201811549205.X |

(56) References Cited

U.S. PATENT DOCUMENTS

| | | | |
|---|---|---|---|
| 9,016,900 | B2 | 4/2015 | Takeuchi et al. |
| 9,761,765 | B2 | 9/2017 | Basin et al. |
| 9,982,854 | B2* | 5/2018 | Ma .................. H01L 33/52 |
| 2004/0008525 | A1 | 1/2004 | Shibata |
| 2012/0119647 | A1 | 5/2012 | Hsu |
| 2013/0058080 | A1* | 3/2013 | Ge .................. F21V 19/005 |
| | | | 362/231 |
| 2013/0058580 | A1 | 3/2013 | Ge et al. |
| 2013/0147348 | A1 | 6/2013 | Motoya et al. |
| 2013/0235592 | A1 | 9/2013 | Takeuchi et al. |
| 2013/0293098 | A1 | 11/2013 | Li et al. |
| 2014/0268779 | A1 | 9/2014 | Sorensen et al. |
| 2014/0369036 | A1 | 12/2014 | Feng |
| 2015/0069442 | A1 | 3/2015 | Liu et al. |
| 2015/0070871 | A1 | 3/2015 | Chen et al. |
| 2015/0255440 | A1 | 9/2015 | Hsieh |
| 2017/0012177 | A1 | 1/2017 | Trottier |
| 2019/0186697 | A1* | 6/2019 | Jiang .................. H05B 45/20 |

FOREIGN PATENT DOCUMENTS

| | | | |
|---|---|---|---|
| CN | 103123949 | A | 5/2013 |
| CN | 203367275 | U | 12/2013 |
| CN | 103560128 | A | 2/2014 |
| CN | 203628391 | U | 6/2014 |
| CN | 103939758 | A | 7/2014 |
| CN | 103956421 | A | 7/2014 |
| CN | 103972364 | A | 8/2014 |
| CN | 103994349 | A | 8/2014 |
| CN | 203880468 | U | 10/2014 |
| CN | 104319345 | A | 1/2015 |
| CN | 204083941 | U | 1/2015 |
| CN | 104456165 | A | 3/2015 |
| CN | 204289439 | U | 4/2015 |
| CN | 104600174 | A | 5/2015 |
| CN | 104600181 | A | 5/2015 |
| CN | 204387765 | U | 6/2015 |
| CN | 105140381 | A | 12/2015 |
| CN | 105161608 | A | 12/2015 |
| CN | 105371243 | A | 3/2016 |
| CN | 105609621 | A | 5/2016 |
| CN | 206973307 | U | 2/2018 |
| CN | 207034659 | U | 2/2018 |
| CN | 108039402 | A | 5/2018 |
| CN | 105090782 | B | 7/2018 |
| CN | 105098032 | A | 7/2018 |
| EP | 2760057 | A1 | 7/2014 |
| EP | 2567145 | B1 | 4/2016 |
| GB | 2547085 | A | 8/2017 |
| JP | 3075689 | U | 2/2001 |
| JP | 2003037239 | A | 2/2003 |
| JP | 2013225587 | A | 10/2013 |
| WO | 2014167458 | A1 | 10/2014 |
| WO | 2017037010 | A1 | 3/2017 |

* cited by examiner

LED FILAMENT LIGHT BULB

CROSS-REFERENCE TO RELATED APPLICATIONS

This application is a continuation application of U.S. application Ser. No. 16/234,124 filed on 2018 Dec. 27, which claims priority to Chinese Patent Applications No. 201510502630.3 filed on 2015 Aug. 17; No. 201510966906.3 filed on 2015 Dec. 19; No. 201610041667.5 filed on 2016 Jan. 22; No. 201610272153.0 filed on 2016 Apr. 27; No. 201610394610.3 filed on 2016 Jun. 3; No. 201610586388.7 filed on 2016 Jul. 22; No. 201610544049.2 filed on 2016 Jul. 7; No. 201610936171.4 filed on 2016 Nov. 1; No. 201611108722.4 filed on 2016 Dec. 6; No. 201610281600.9 filed on 2016 Apr. 29; No. 201710024877.8 filed on 2017 Jan. 13; No. 201710079423.0 filed on 2017 Feb. 14; No. 201710138009.2 filed on 2017 Mar. 9; No. 201710180574.5 filed on 2017 Mar. 23; No. 201710234618.8 filed on 2017 Apr. 11; No. 201410510593.6 filed on 2014 Sep. 28; No. 201510053077.X filed on 2015 Feb. 2; No. 201510489363.0 filed on 2015 Aug. 7; No. 201510555889.4 filed on 2015 Sep. 2; No. 201710316641.1 filed on 2017 May 8; No. 201710839083.7 filed on 2017 Sep. 18; No. 201710883625.0 filed on 2017 Sep. 26; No. 201730450712.8 filed on 2017 Sep. 21; No. 201730453239.9 filed on 2017 Sep. 22; No. 201730453237.X filed on 2017 Sep. 22; No. 201730537542.7 filed on 2017 Nov. 3; No. 201730537544.6 filed on 2017 Nov. 3; No. 201730520672.X filed on 2017 Oct. 30; No. 201730517887.6 filed on 2017 Oct. 27; No. 201730489929.X filed on 2017 Oct. 16; No. 201711434993.3 filed on 2017 Dec. 26; No. 201711477767.3 filed on 2017 Dec. 29; No. 201810031786.1 filed on 2018 Jan. 12; No. 201810065369.9 filed on 2018 Jan. 23; No. 201810343825.1 filed on 2018 Apr. 17; No. 201810344630.9 filed on 2018 Apr. 17; No. 201810501350.4 filed on 2018 May 23; No. 201810498980.0 filed on 2018 May 23; No. 201810573314.9 filed on 2018 Jun. 6; No. 201810836433.9 filed on 2018 Jul. 26; No. 201810943054.X filed on 2018 Aug. 17; No. 201811005536.7 filed on 10 2018 Aug. 30; No. 201811005145.5 filed on 2018 Aug. 30; No. 201811079889.1 filed on 2018 Sep. 17; No. 201811277980.4 filed on 2018 Oct. 30; No. 201811285657.1 filed on 2018 Oct. 31; No. 201811378173.1 filed on 2018 Nov. 19; No. 201811378189.2 filed on 2018 Nov. 19; No. 201811549205.X filed on 2018 Dec. 18, each of which is hereby incorporated by reference in its entirety

TECHNICAL FIELD

The present disclosure relates to a lighting field, and more particularly to an LED filament light bulb.

RELATED ART

Incandescent bulbs have been widely used for homes or commercial lighting for decades. However, incandescent bulbs are generally with lower efficiency in terms of energy application, and about 90% of energy input can be converted into a heat form to dissipate. In addition, because the incandescent bulb has a very limited lifespan (about 1,000 hours), it needs to be frequently replaced. These traditional incandescent bulbs are gradually replaced by other more efficient lighting devices, such as fluorescent lights, high-intensity discharge lamps, light-emitting diodes (LEDs) lights and the like. In these electric lamps, the LED light lamp attracts widespread attention in its lighting technology. The LED light lamp has the advantages of long lifespan, small in size, environmental protection and the like, therefore the application of the LED light lamp continuously grows.

In recent years, LED light bulbs with LED filaments have been provided on the market. At present, LED light bulbs using LED filaments as illumination sources still have the following problems to be improved.

There is one kind of LED soft filament, which is similar to the structure of the above-mentioned LED hard filament and is employed a flexible printed circuit substrate (hereinafter referred to FPC) instead of the glass substrate to enable the LED filament having a certain degree of bending. However, by utilizing the LED soft filament made of the FPC, the FPC has a thermal expansion coefficient different from that of the silicon gel coated covering the LED soft filament, and the long-term use causes the displacement or even degumming of the LED chips. Moreover, the FPC may not beneficial to flexible adjustment of the process conditions and the like. Besides, during bending the LED soft filament it has a challenge in the stability of the metal wire bonded between LED chips. When the arrangement of the LED chips in the LED soft filament is dense, if the adjacent LED chips are connected by means of metal wire bonding, it is easy to cause the stress to be concentrated on a specific part of the LED soft filament when the LED soft filament is bent, thereby the metal wire bonding between the LED chips are damaged and even broken.

In order to increase the aesthetic appearance and make the illumination appearance more uniform, an LED light bulb has a plurality of LED filaments, which are disposed with different placement or angles. However, since the plurality of LED filaments need to be installed in a single LED light bulb, and these LED filaments need to be fixed individually, the assembly process will be more complicated and the production cost will be increased.

In addition, since the driving requirements for lighting the LED filament are substantially different from for lighting the conventional tungsten filament lamp. Therefore, for LED light bulbs, how to design a power supply circuitry with a stable current to reduce the ripple phenomenon of the LED filament in an acceptable level so that the user does not feel the flicker is one of the design considerations. Besides, under the space constraints and the premises of achieving the required light efficiency and the driving requirements, how to design a power supply circuitry with the structure simply enough to embed into the space of the lamp head is also a focus of attention.

SUMMARY

It is noted that the present disclosure includes one or more inventive solutions currently claimed or not claimed, and in order to avoid confusion between the illustration of these embodiments in the specification, a number of possible inventive aspects herein may be collectively referred to "present/the invention."

A number of embodiments are described herein with respect to "the invention." However, the word "the invention" is used merely to describe certain embodiments disclosed in this specification, whether or not in the claims, is not a complete description of all possible embodiments.

Some embodiments of various features or aspects described below as "the invention" may be combined in various ways to form an LED light bulb or a portion thereof.

In accordance with another embodiment of the present invention, an LED filament comprises at least one LED section, a conductive section, at least two conductive electrodes and a light conversion layer. The conductive section is located between two adjacent LED sections. The two conductive electrodes are disposed on the LED filament correspondingly and electrically connected to each of the LED sections. The adjacent two LED sections are electrically connected to each other through the conductive section. Each of the LED sections includes at least two LED chips, and the LED chips are electrically connected to each other by at least one wire. The light conversion layer covers the LED sections, the conductive sections and the conductive electrodes, and a part of each of the two electrodes is exposed respectively.

In accordance with an embodiment of the present invention, the conductive section includes a conductor connecting with the LED section, and the length of the wire connecting between the LED chips is less than the length of the conductor.

In accordance with an embodiment of the present invention, the light conversion layer includes at least one top layer and one base layer.

In accordance with an embodiment of the present invention, the proportional relationship between the width W1 of the base layer or the top layer and the width W2 of the LED chip is W1:W2=1:0.8 to 0.9.

In accordance with an embodiment of the present invention, an LED filament comprises a plurality of LED chip units, a plurality of conductors, and at least two conductive electrodes. Wherein each of the conductors is located between two adjacent LED chip units, the LED chip units are disposed at different heights, and the conductive electrodes are disposed corresponding to the LED chip units configuration and electrically connected to the LED chip unit by the wire. The adjacent two LED chip units are electrically connected to each other through a conductor, and the angle between the conductor and the extending direction of length of the LED filament is in a range of about 30° to 120°. In accordance with another embodiment of the present invention provides a composition which is suitable for use as a filament substrate or a light conversion layer, wherein the composition comprises at least a main material, a modifier and an additive. The main material is an organosilicon-modified polyimide; the modifier is a thermal curing agent; and the additives comprise microparticles added into the main material, which may comprise phosphor particles, heat dispersing particles. The additive also comprises a coupling agent.

The present disclosure provides a composition which is suitable for use as a filament substrate or a light-conversion layer, wherein the main material in the composition is an organosilicon-modified polyimide, i.e. a polyimide comprising a siloxane moiety, wherein the organosilicon-modified polyimide comprises a repeating unit represented by general formula (I):

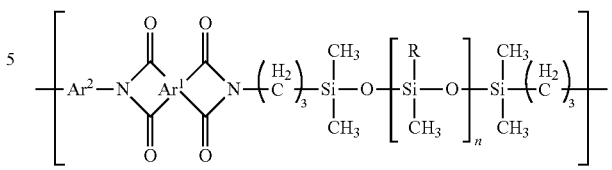

Formula (I)

In general formula (I), $Ar^1$ is a tetra-valent organic group having a benzene ring or an alicyclic hydrocarbon structure, $Ar^2$ is a di-valent organic group, R is each independently methyl or phenyl, and n is 1~5.

According to an embodiment of the present disclosure, $Ar^1$ is a tetra-valent organic group having a monocyclic alicyclic hydrocarbon structure or a bridged-ring alicyclic hydrocarbon structure.

According to another embodiment of the present disclosure, $Ar^2$ is a di-valent organic group having a monocyclic alicyclic hydrocarbon structure.

To make the above and other objects, features, and advantages of the present invention clearer and easier to understand, the following embodiments will be described in detail with reference to the accompanying drawings.

BRIEF DESCRIPTION OF THE DRAWINGS

The present invention will become more readily apparent to those ordinarily skilled in the art after reviewing the following detailed description and accompanying drawings, in which.

DETAILED DESCRIPTION

The present disclosure provides a novel LED filament and its application the LED light bulb. The present disclosure will now be described in the following embodiments with reference to the drawings. The following descriptions of various implementations are presented herein for purpose of illustration and giving examples only. This invention is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

Figure 1:
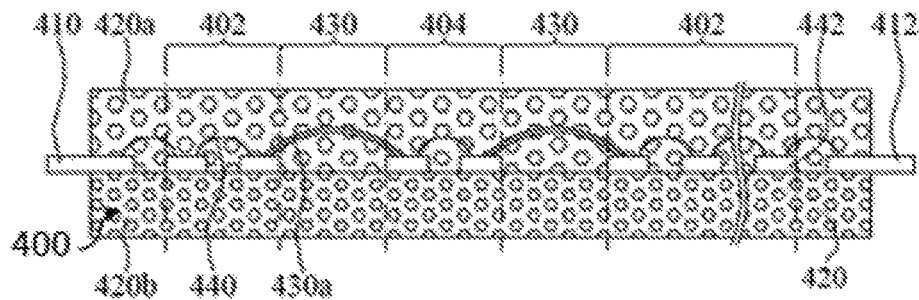
FIG. 1 is a cross sectional view of an LED filament in accordance with an embodiment of the present invention.

FIG. 1 is a schematic structural view of another embodiment of an LED filament of the present invention. As shown in FIG. 1, the LED filament 400 has a light conversion layer 420, LED sections 402, 404, conductive electrodes 410, 412, and a conductive section 430 for electrically connecting adjacent two LED sections 402, 404. Each of the LED sections 402, 404 includes at least two LED chips 442 that are electrically connected to each other by the wires 440. In the present embodiment, the conductive section 430 includes at least one conductor 430a that connects the adjacent LED sections 402, 404, wherein the shortest distance between the two LED chips 442 respectively located in the two adjacent LED sections 402, 404 is greater than the distance between two adjacent LED chips 442 within the one LED section 402/404. Therefore, it is ensured that when the two LED sections 402, 404 are bent, the conductive section 430 is not easily broken due to the stress of bending. The length of the wire 440 is less than the length of the conductor 430a. The light conversion layer 420 is coated on at least two sides of the LED chip 442 and conductive electrodes 410, 412, and a portion of each of the conductive electrodes 410, 412 is not coated with the light conversion layer 420. The light conversion layer 420 may have at least one top layer 420a (or upper layer) and one base layer 420b (or lower layer). In the present embodiment, the top layer 420a and the base layer 420b are disposed on the opposing surface of the LED chip 442 and conductive electrodes 410, 412, and a portion of each of the conductive electrodes 410, 412 is excluded. It should be particularly noted that the thickness, diameter or width of the top layer 420a in the LED sections 402, 404 or the conductive section 430 described pertaining to FIG. 1 refers in radial direction of the LED filament. The thickness of the top layer 420a is the distance between its outer surface to the interface of the top layer 420a and the base layer 420b, or the distance from its outer surface and the interface of the LED chip 442 or the conductor 430a and the base layer 420b, wherein the outer surface of the top layer 420a is a surface away from the base layer.

Figure 2A:
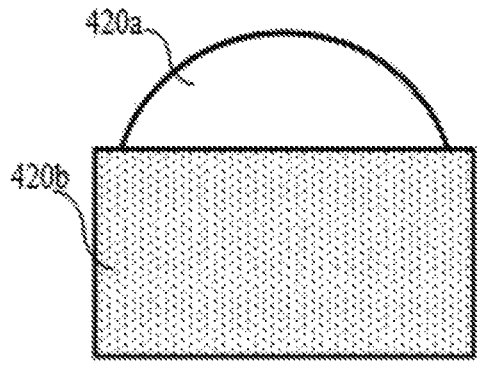
FIG. 2A to 2B are cross sectional views of various LED filaments in accordance with the present invention.
Figure 2B:
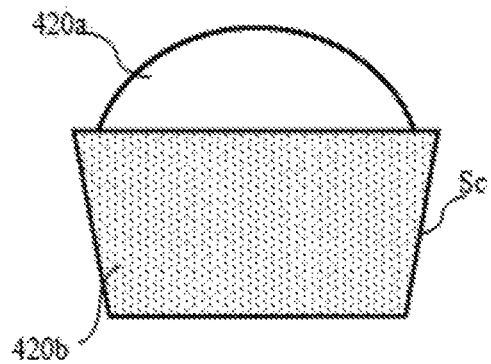
Figure 2C:
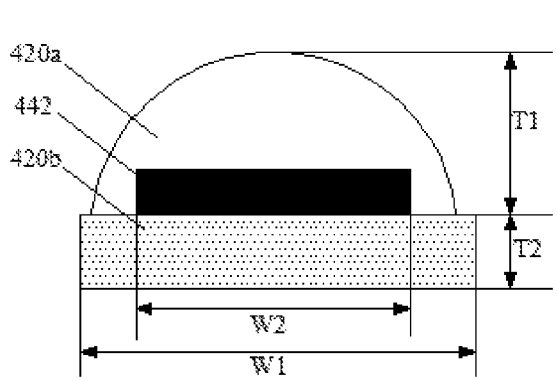
FIGS. 2C and 2D are schematic views showing the placement of the LED chip in FIGS. 2A and 2B.

According to the aforementioned embodiments of the present invention, since the LED filament structure is provided with at least one LED section and at least one conductive section, when the LED filament is bent, the stress is easily concentrated on the conductive section. Therefore, the breakage probability of the gold wire connected between the adjacent LED chips is reduced during bending. Thereby, the quality of the LED filament and its application is improved. Next, a related design of the layer structure of the LED filament structure will be described. FIG. 2A to 2B are cross-sectional views of an LED filament according to different embodiments of the present invention. FIG. 2C is a schematic view showing the arrangement of the LED chip 442 inside the FIG. 2A. The thickness and diameter of the base layer 420b may be smaller than that of the top layer 420a. As shown in FIG. 2C, the thickness T2 of the base layer 420b is smaller than the thickness T1 of the top layer 420a, and the thickness of the base layer 420b or the top layer 420a may be uneven due to the process, therefore, the T1 and T2 represent the maximum thickness of the top layer 420a and the base layer 420b, respectively. Besides, the LED chip 442 is placed on the surface of the base layer 420b and wrapped in the top layer 420a. In some aspects, the conductive electrode of an LED filament (not shown) may be disposed primarily in the base layer 420b.

Figure 2D:
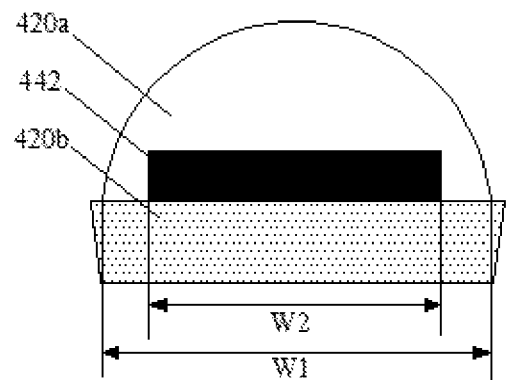

Referring to FIGS. 2C and 2D, W1 is the width of the base layer 420b or the top layer 420a, and W2 is the width of the LED chip 442. When the width of the base layer 420b or the top layer 420a is not uniform, W1 represents the width of the upper surface of the base layer 420b or the width of the lower surface of the top layer 420a, the proportion of W1 and W2 is W1: W2=1: (0.8 to 0.9). The upper surface of the base layer 420b contacts the LED chip 402, and the lower surface thereof is away from the LED chip 442 and opposite to the upper surface of the base layer 420b, in contrast, the upper surface of the top layer 420b is away from the LED chip 442, and the lower surface thereof is opposite to the upper surface of the top layer 420b and contacts the base layer 420a. In FIG. 2C, W1 indicates the width of the upper surface of the base layer 420b or the minimum width of the base layer 420b. FIG. 2D is a schematic view showing the arrangement of the LED chip 402 inside the FIG. 2B, and W1 is the width of the lower surface of the top layer 420b or the maximum width of the top layer 420a. The LED chip 442 is a six faced illuminator, in order to ensure lateral illuminating of the LED filament, that is lateral faces of the LED chip 442 are still covered by the top layer 402a, the widths W1 and W2 can be designed to be unequal and the width W1 is greater than the width of W2. On the other hand, in order to ensure that the LED filament has a certain flexibility and can be bent with a small curvature radius, in other words, for making sure that the filament retains a certain degree of flexibility, therefore, the ratio of the thickness and the width of the cross section of the LED filament which is perpendicular to the longitudinal direction of the LED filament is ideally tended to be consistent. With this design, the LED filament can be easily realized with an omni-directional light effect and has a better bending property.

Figure 3A:
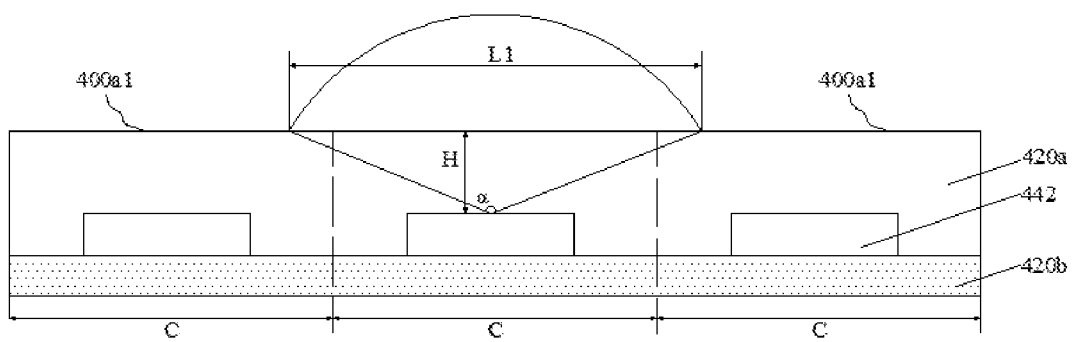
FIG. 3A is a cross sectional view showing the LED filament in the axial direction of the LED filament.
Figure 3B:
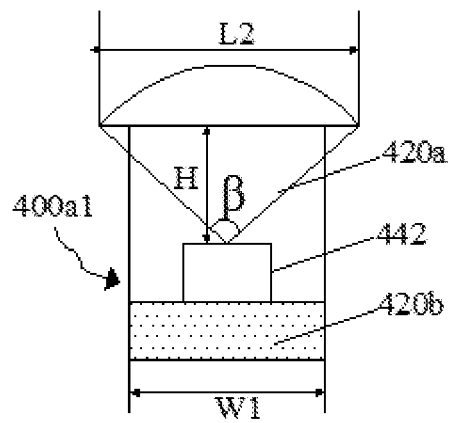
FIG. 3B is a cross-sectional view showing the LED filament in the radial direction of the LED filament.

Referring to FIG. 3A, FIG. 3A shows the cross sectional view of a portion of the LED filament 400 in the longitudinal direction of the LED filament 400, FIG. 3A shows three LED filament units 400a1 and each LED filament unit 400a1 includes a single LED chip 442. FIG. 3B is a cross sectional view of the LED filament unit 400a1 in the short axial direction of the LED filament. As shown in FIGS. 3A and 19B, the illumination angle of the LED chip 442 in the longitudinal direction of the LED filament is a, the illumination angle of the LED chip 442 in the short axial direction of the LED filament is 13, and the surface of the LED chip 442 away from the base layer 420b is defined by the upper surface of the LED chip 442, the distance from the upper surface of the LED chip 442 to the outer surface of the top layer is H, and the length of the LED filament unit 400a1 in the longitudinal direction of the LED filament is C, and the light emitting area of an LED chip 442 in the LED filament in the longitudinal direction of the LED filament is the illumination coverage of the illumination angle α, the LED chip emits the light along with the illumination angle α and it projects on the outer surface of the top layer 420a with a length of the linear distance L1. The light emitting area of an LED chip 442 in the LED filament in the short axial direction of the LED filament is the illumination coverage of the illumination angle β, the LED chip emits the light along with the illumination angle θ and it projects on the outer surface of the top layer 420a with a length of the linear distance L2. It is considered that the LED filament has ideal light emitting area, better bending property, thermal dissipation performance, avoiding to occur obvious dark areas of LED filament and reducing material waste, etc. at the same time, the L1 value can be designed by the equation as $0.5C \leq L1 \leq 10C$, preferably $C \leq L1 \leq 2C$. Further, under the equation $L2 \geq W1$, if the L1 value is smaller than the C value, the light emitting areas of the adjacent LED chips 442 in the longitudinal direction cannot be intersected, therefore the LED filament may have a dark area in the longitudinal direction. Moreover, when the L2 value is smaller than the W1 value, it represents the width of the LED chip 442 in the short axial direction of the filament is too large, and it is also possible to cause the top layer 420a having dark areas on both sides in the short axial direction. The dark areas not only affect the overall light illumination efficiency of the LED filament, but also indirectly cause waste of material use. The specific values of $\alpha$, $\beta$ depend on the type or specification of the LED chip 442.

In one embodiment, in the longitudinal direction of the LED filament:

$$H = L1/2 \tan 0.5\alpha, 0.5C \leq L1 \leq 10C, \text{then } 0.5C/2 \tan 0.5\alpha \leq H \leq 10C/2 \tan 0.5\alpha;$$

in the short axial direction of the LED:

$$H = L2/2 \tan 0.5\beta, L2 \geq W1, \text{then } H \geq W1/2 \tan 0.5\beta;$$

therefore, $H\max = 10C/2 \tan 0.5\alpha$, $H\min = a$; setting a is the maximum value in both $0.5C/2 \tan 0.5\alpha$ and $W1/2 \tan 0.5\beta$, and setting A is the maximum value in both $C/2 \tan 0.5\alpha$ and $W1/2 \tan 0.5\beta$.

Thus, the equation between the distance H and the setting value a and A respectively as $a \leq H \leq 10C/2 \tan 0.5\alpha$, preferably $A \leq H \leq 2C/2 \tan 0.5\alpha$. When the type of the LED chip 442, the spacing between adjacent LED chips, and the width of the filament are known, the distance H from the light emitting surface of the LED chip 442 to the outer surface of the top layer can be determined, so that the LED filament has a superior light emitting area in both the short axial and longitudinal direction of the LED filament.

Most LED chips have an illumination angle of 120° in both the short axial and longitudinal direction of the LED filament. The setting b is the maximum of $0.14C$ and $0.28W1$, and B is the maximum of $0.28C$ and $0.28W1$, then the equation between the distance H and the setting value b and B respectively as $b \leq H \leq 2.9C$ and preferably $B \leq H \leq 0.58C$.

In one embodiment, in the longitudinal direction of the LED filament:

$$H = L1/2 \tan 0.5\alpha, 0.5C \leq L1 \leq 10C;$$

in the short axial direction of the LED filament:

$$H = L2/2 \tan 0.5\beta, L2 \geq W1; \text{then } W1 \leq 2H \tan 0.5\beta;$$

then $0.5C \tan 0.5\beta/\tan 0.5\alpha \leq L2 \leq 10C \tan 0.5\beta/\tan 0.5\alpha, L2 \geq W1$;

therefore, $W1 \leq 10C \tan 0.5\beta/\tan 0.5\alpha$, thus $W1 \max = \min (10C \tan 0.5\beta/\tan 0.5\alpha, 2H \tan 0.5\beta)$.

The relationship between the LED chip width W2 and the base layer width W1 is set to $W1:W2=1:0.8$ to $0.9$, so that the minimum of W1 as $W1 \min = W2/0.9$ can be known.

Setting d is the minimum of $10C \tan 0.5\beta/\tan 0.5\alpha$ and $2H \tan 0.5\beta$, and D is the minimum of $2C \tan 0.5\beta/\tan 0.5\alpha$ and $2H \tan 0.5\beta$, then the equation between the base layer width W1, the LED chip width W2, and the setting value d and D respectively is $W2/0.9 \leq W1 \leq d$, preferably $W2/0.9 \leq W1 \leq D$.

When the type of the LED chip 442, the distance between the adjacent two LED chips in the LED filament, and the H value are known, the range of the width W of the LED filament can be calculated, so that the LED filament can be ensured in the short axial direction and the longitudinal direction of the LED filament both have superior light emitting areas.

Most of the LED chips have an illumination angle of 120° in the short axial and in the longitudinal direction of the LED filament, the e is set to a minimum value of $10C$ and $3.46H$, and the E is set to a minimum value of $2C$ and $3.46H$, in the case the equation between the width W1, W2 and the setting value e and E respectively as $1.1W2 \leq W1 \leq e$, preferably $1.1W2 \leq W1 \leq E$.

In one embodiment, in the longitudinal direction of the LED filament:

$$H = L1/2 \tan 0.5\alpha, 0.5C \leq L1 \leq 10C, \text{then } 0.2H \tan 0.5\alpha \leq C \leq 4H \tan 0.5\alpha;$$

in the short axial direction of the LED filament:

$$H = L2/2 \tan 0.5\beta, L2 \geq W1, \text{then } L1 \geq W1 \tan 0.5\alpha/\tan 0.5\beta;$$

thus $W1 \tan 0.5\alpha/\tan 0.5\beta \leq 10C$, and $C \geq 0.1 W1 \tan 0.5\alpha/\tan 0.5\beta$;

then $C \max = 4H \tan 0.5\alpha$.

Setting f is the maximum value of both $0.2H \tan 0.5\alpha$ and $0.1W1 \tan 0.5\alpha/\tan 0.5\beta$, and setting F is the maximum value of both $H \tan 0.5\alpha$ and $0.1W1 \tan 0.5\alpha/\tan 0.5\beta$, therefore $f \leq C \leq 4H \tan 0.5\alpha$, preferably $F \leq C \leq 2H \tan 0.5\alpha$.

When the width W, the H value, and type of the LED chip 442 of the LED filament are determined, the range of the width C of the LED filament can be known, so that the LED filament has superior light emitting area in both the short axial direction and the longitudinal direction of the LED filament.

Most LED chips have an illumination angle of 120° in the short axial direction and in the longitudinal direction of the LED filament of the LED filament. The setting g is the maximum value of $0.34H$ and $0.1W1$, and setting G is the maximum value of $1.73H$ and $0.1W1$, thereby the equation between the value C, H and the setting value g and G respectively as $g \leq C \leq 6.92H$, preferably $G \leq C \leq 3.46H$.

In the above embodiment, since the thickness of the LED chip 442 is small relative to the thickness of the top layer 420a, it is negligible in most cases, that is, the H value may also represent the actual thickness of the top layer 420a. In other embodiments, the light conversion layer is similar to the structure of the light conversion layer 420 as shown in FIG. 1, the height of the top layer 420a is suitable for the range of the H value as aforementioned equation.

Figure 4:
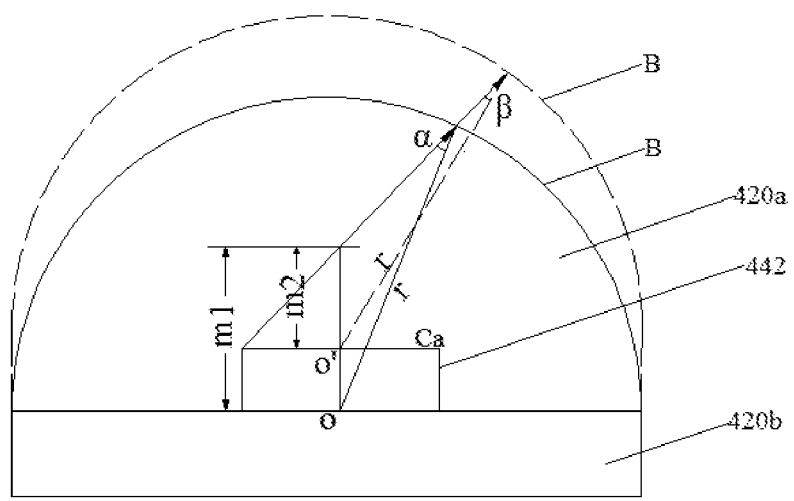
FIG. 4 is a cross sectional view showing another embodiment of the LED filament in accordance with the present invention.

As shown in FIG. 4, the center O of the top layer 420a indicated by the solid line does not overlap with the light emitting surface Ca of the LED chip, and the center O' of the top layer 420a indicated by the dashed line overlaps with the light emitting surface of the LED chip, and the radius of the semicircle with the center of O and the radius of the semicircle of O' is equal. As shown in the figure, $\tan \alpha = m1/r$ and $\tan \beta = m2/r$, m1 is greater than m2, and thus $\alpha$ is greater than $\beta$, so that when the light emitting surface overlaps with the center of the top layer 420a, that is the distance from the center point to the outer surface of the top layer is substantially the same, the light emitting efficiency is better.

The next part will describe the material of the filament of the present invention. The material suitable for manufacturing a filament substrate or a light-conversion layer for LED should have properties such as excellent light transmission, good heat resistance, excellent thermal conductivity, appropriate refraction rate, excellent mechanical properties and good warpage resistance. All the above properties can be achieved by adjusting the type and the content of the main material, the modifier and the additive contained in the organosilicon-modified polyimide composition. The present disclosure provides a filament substrate or a light-conversion layer formed from a composition comprising an organosilicon-modified polyimide. The composition can meet the requirements on the above properties. In addition, the type and the content of one or more of the main material, the modifier (thermal curing agent) and the additive in the composition can be modified to adjust the properties of the filament substrate or the light-conversion layer, so as to meet special environmental requirements. The modification of each property is described herein below.

Adjustment of the Organosilicon-Modified Polyimide

The organosilicon-modified polyimide provided herein comprises a repeating unit represented by the following general formula (I):

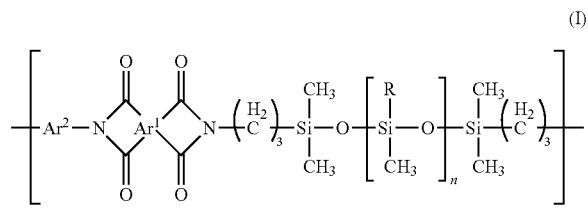

In general formula (I), $Ar^1$ is a tetra-valent organic group. The organic group has a benzene ring or an alicyclic hydrocarbon structure. The alicyclic hydrocarbon structure may be monocyclic alicyclic hydrocarbon structure or a bridged-ring alicyclic hydrocarbon structure, which may be a dicyclic alicyclic hydrocarbon structure or a tricyclic alicyclic hydrocarbon structure. The organic group may also be a benzene ring or an alicyclic hydrocarbon structure comprising a functional group having active hydrogen, wherein the functional group having active hydrogen is one or more of hydroxyl, amino, carboxy, amido and mercapto.

$Ar^2$ is a di-valent organic group, which organic group may have for example a monocyclic alicyclic hydrocarbon structure or a di-valent organic group comprising a functional group having active hydrogen, wherein the functional group having active hydrogen is one or more of hydroxyl, amino, carboxy, amido and mercapto.

R is each independently methyl or phenyl.

n is 1~5, preferably 1, 2, 3 or 5.

The polymer of general formula (I) has a number average molecular weight of 5000~100000, preferably 10000~60000, more preferably 20000~40000. The number average molecular weight is determined by gel permeation chromatography (GPC) and calculated based on a calibration curve obtained by using standard polystyrene. When the number average molecular weight is below 5000, a good mechanical property is hard to be obtained after curing, especially the elongation tends to decrease. On the other hand, when it exceeds 100000, the viscosity becomes too high and the resin is hard to be formed.

$Ar^1$ is a component derived from a dianhydride, which may be an aromatic anhydride or an aliphatic anhydride. The aromatic anhydride includes an aromatic anhydride comprising only a benzene ring, a fluorinated aromatic anhydride, an aromatic anhydride comprising amido group, an aromatic anhydride comprising ester group, an aromatic anhydride comprising ether group, an aromatic anhydride comprising sulfide group, an aromatic anhydride comprising sulfonyl group, and an aromatic anhydride comprising carbonyl group.

Examples of the aromatic anhydride comprising only a benzene ring include pyromellitic dianhydride (PMDA), 2,3,3',4'-biphenyl tetracarboxylic dianhydride (aBPDA), 3,3',4,4'-biphenyl tetracarboxylic dianhydride (sBPDA), and 4-(2,5-dioxotetrahydrofuran-3-yl)-1,2,3,4-tetrahydro naphthalene-1,2-dicarboxylic anhydride (TDA). Examples of the fluorinated aromatic anhydride include 4,4'-(hexafluoroisopropylidene)diphthalic anhydride which is referred to as 6FDA. Examples of the aromatic anhydride comprising amido group include N,N-(5,5'-(perfluoropropane-2,2-diyl) bis(2-hydroxy-5,1-phenylene))bis(1,3-dioxo-1,3-dihydroisobenzofur an)-5-arboxamide) (6FAP-ATA), and N,N'-(9H-fluoren-9-ylidenedi-4,1-phenylene)bis[1,3-dihydro-1, 3-dioxo-5-isobenzofuran carboxamide] (FDA-ATA). Examples of the aromatic anhydride comprising ester group include p-phenylene bis(trimellitate) dianhydride (TAHQ). Examples of the aromatic anhydride comprising ether group include 4,4'-(4,4'-isopropylidenediphenoxy)bis(phthalic anhydride) (BPADA), 4,4'-oxydiphthalic dianhydride (sODPA), 2,3,3',4'-diphenyl ether tetracarboxylic dianhydride (aODPA), and 4,4'-(4,4'-isopropylidenediphenoxy)bis (phthalic anhydride)(BPADA). Examples of the aromatic anhydride comprising sulfide group include 4,4'-bis(phthalic anhydride)sulfide (TPDA). Examples of the aromatic anhydride comprising sulfonyl group include 3,3',4,4'-diphenylsulfonetetracarboxylic dianhydride (DSDA). Examples of the aromatic anhydride comprising carbonyl group include 3,3',4,4'-benzophenonetetracarboxylic dianhydride (BTDA).

The alicyclic anhydride includes 1,2,4,5-cyclohexanetetracarboxylic acid dianhydride which is referred to as HPMDA, 1,2,3,4-butanetetracarboxylic dianhydride (BDA), tetrahydro-1H-5,9-methanopyrano[3,4-d]oxepine-1,3,6,8 (4H)-tetrone (TCA), hexahydro-4,8-ethano-1H,3H-benzo [1,2-C:4,5-C']difuran-1,3,5,7-tetrone (BODA), cyclobutane-1,2,3,4-tetracarboxylic dianhydride(CBDA), and 1,2,3,4-cyclopentanetetracarboxylic dianhydride (CpDA); or alicyclic anhydride comprising an olefin structure, such as bicyclo[2.2.2]oct-7-ene-2,3,5,6-tetracarboxylic dianhydride (COeDA). When an anhydride comprising ethynyl such as 4,4'-(ethyne-1,2-diyl)diphthalic anhydride (EBPA) is used, the mechanical strength of the light-conversion layer can be further ensured by post-curing.

Considering the solubility, 4,4'-oxydiphthalic anhydride (sODPA), 3,3',4,4'-benzophenonetetracarboxylic dianhydride (BTDA), cyclobutanetetracarboxylic dianhydride (CBDA) and 4,4'-(hexafluoroisopropylidene)diphthalic anhydride (6FDA) are preferred. The above dianhydride can be used alone or in combination.

$Ar^2$ is derived from diamine which may be an aromatic diamine or an aliphatic diamine. The aromatic diamine includes an aromatic diamine comprising only a benzene ring, a fluorinated aromatic diamine, an aromatic diamine comprising ester group, an aromatic diamine comprising ether group, an aromatic diamine comprising amido group, an aromatic diamine comprising carbonyl group, an aromatic diamine comprising hydroxyl group, an aromatic diamine comprising carboxy group, an aromatic diamine comprising sulfonyl group, and an aromatic diamine comprising sulfide group.

The aromatic diamine comprising only a benzene ring includes m-phenylenediamine, p-phenylenediamine, 2,4-diaminotoluene, 2,6-diamino-3,5-diethyltoluene, 3,3'-dimethylbiphenyl-4,4'-diamine 9,9-bis(4-aminophenyl)fluorene (FDA), 9,9-bis(4-amino-3-methylphenyl)fluorene, 2,2-bis(4-aminophenyl)propane, 2,2-bis(3-methyl-4-aminophenyl)propane, 4,4'-diamino-2,2'-dimethylbiphenyl(APB). The fluorinated aromatic diamine includes 2,2'-bis(trifluoromethyl)benzidine (TFMB), 2,2-bis(4-aminophenyl)hexafluoropropane (6FDAM), 2,2-bis[4-(4-aminophenoxy)phenyl]hexafluoropropane (HFBAPP), and 2,2-bis(3-amino-4-methylphenyl)hexafluoropropane (BIS-AF-AF). The aromatic diamine comprising ester group includes [4-(4-aminobenzoyl)oxyphenyl]4-aminobenzoate (ABHQ), bis(4-aminophenyl)terephthalate(BPTP), and 4-aminophenyl 4-aminobenzoate (APAB). The aromatic diamine comprising ether group includes 2,2-bis[4-(4-aminophenoxy)phenyl]propane) (BAPP), 2,2'-bis[4-(4-aminophenoxy)phenyl]propane (ET-BDM), 2,7-bis(4-aminophenoxy)-naphthalene (ET-2,7-Na), 1,3-bis(3-aminophenoxy)benzene (TPE-M), 4,4'-[1,4-phenyldi(oxy)]bis[3-(trifluoromethyl)aniline] (p-6FAPB), 3,4'-diaminodiphenyl ether, 4,4'-diaminodiphenyl ether (ODA), 1,3-bis(4-aminophenoxy)benzene (TPE-R), 1,4-bis(4-aminophenoxy)benzene (TPE-Q), and 4,4'-bis(4-aminophenoxy)biphenyl(BAPB). The aromatic diamine comprising amido group includes N,N'-bis(4-aminophenyl)benzene-1,4-dicarboxamide (BPTPA), 3,4'-diamino benzanilide (m-APABA), and 4,4'-diaminobenzanilide (DABA). The aromatic diamine comprising carbonyl group includes 4,4'-diaminobenzophenone (4,4'-DABP), and bis(4-amino-3-carboxyphenyl) methane (or referred to as 6,6'-diamino-3,3'-methylanediyl-dibenzoic acid). The aromatic diamine comprising hydroxyl group includes 3,3'-dihydroxybenzidine (HAB), and 2,2-bis(3-amino-4-hydroxyphenyl)hexafluoropropane (6FAP). The aromatic diamine comprising carboxy group includes 6,6'-diamino-3,3'-methylanediyl-dibenzoic acid (MBAA), and 3,5-diaminobenzoic acid (DBA). The aromatic diamine comprising sulfonyl group includes 3,3'-diaminodiphenyl sulfone (DDS),4,4'-diaminodiphenyl sulfone, bis[4-(4-aminophenoxy)phenyl]sulfone (BAPS) (or referred to as 4,4'-bis(4-aminophenoxy)diphenylsulfone), and 3,3'-diamino-4,4'-dihydroxydiphenyl sulfone (ABPS). The aromatic diamine comprising sulfide group includes 4,4'-diaminodiphenyl sulfide.

The aliphatic diamine is a diamine which does not comprise any aromatic structure (e.g., benzene ring). The aliphatic diamine includes monocyclic alicyclic amine and straight chain aliphatic diamine, wherein the straight chain aliphatic diamine include siloxane diamine, straight chain alkyl diamine and straight chain aliphatic diamine comprising ether group. The monocyclic alicyclic diamine includes 4,4'-diaminodicyclohexylmethane (PACM), and 3,3'-dimethyl-4,4-diaminodicyclohexylmethane (DMDC). The siloxane diamine (or referred to as amino-modified silicone) includes α,ω-(3-aminopropyl)polysiloxane (KF8010), X22-161A, X22-161B, NH15D, and 1,3-bis(3-aminopropyl)-1,1,3,3-tetramethyldisiloxane (PAME). The straight chain alkyl diamine has 6~12 carbon atoms, and is preferably unsubstituted straight chain alkyl diamine. The straight chain aliphatic diamine comprising ether group includes ethylene glycol di(3-aminopropyl) ether.

The diamine can also be a diamine comprising fluorenyl group. The fluorenyl group has a bulky free volume and rigid fused-ring structure, which renders the polyimide good heat resistance, thermal and oxidation stabilities, mechanical properties, optical transparency and good solubility in organic solvents. The diamine comprising fluorenyl group, such as 9,9-bis(3,5-difluoro-4-aminophenyl)fluorene, may be obtained through a reaction between 9-fluorenone and 2,6-dichloroaniline. The fluorinated diamine can be 1,4-bis(3'-amino-5'-trifluoromethylphenoxy)biphenyl, which is a meta-substituted fluorine-containing diamine having a rigid biphenyl structure. The meta-substituted structure can hinder the charge flow along the molecular chain and reduce the intermolecular conjugation, thereby reducing the absorption of visible lights. Using asymmetric diamine or anhydride can increase to some extent the transparency of the organosilicon-modified polyimide resin composition. The above diamines can be used alone or in combination.

Examples of diamines having active hydrogen include diamines comprising hydroxyl group, such as 3,3'-diamino-4,4'-dihydroxybiphenyl, 4,4'-diamino-3,3'-dihydroxy-1,1'-biphenyl (or referred to as 3,3'-dihydroxybenzidine) (HAB), 2,2-bis(3-amino-4-hydroxyphenyl)propane(BAP), 2,2-bis(3-amino-4-hydroxyphenyl)hexafluoropropane(6FAP), 1,3-bis(3-hydro-4-aminophenoxy) benzene, 1,4-bis(3-hydroxy-4-aminophenyl)benzene and 3,3'-diamino-4,4'-dihydroxydiphenyl sulfone (ABPS). Examples of diamines comprising carboxy group include 3,5-diaminobenzoic acid, bis(4-amino-3-carboxyphenyl)methane (or referred to as 6,6'-diamino-3,3'-methylenedibenzoic acid), 3,5-bis(4-aminophenoxy)benzoic acid, and 1,3-bis(4-amino-2-carboxyphenoxy)benzene. Examples of diamines comprising amino group include 4,4'-diaminobenzanilide (DABA), 2-(4-aminophenyl)-5-aminobenzoimidazole, diethylenetriamine, 3,3'-diaminodipropylamine, triethylenetetramine, and N,N'-bis(3-aminopropyl)ethylenediamine (or referred to as N,N-di(3-aminopropyl)ethylethylamine). Examples of diamines comprising thiol group include 3,4-diaminobenzenethiol. The above diamines can be used alone or in combination.

In one embodiment for preparing the organosilicon-modified polyimide, the organosilicon-modified polyimide can be produced by dissolving the polyimide obtained by heating and dehydration after mixing a diamine and an anhydride and a siloxane diamine in a solvent. In another embodiment, the amidic acid, before converting to polyimide, is reacted with the siloxane diamine.

The molar ratio of dianhydride to diamine may be 1:1. The molar percentage of the diaminecomprising a functional group having active hydrogen may be 5~25% of the total amount of diamine. The temperature under which the polyimide is synthesized is preferably 80~250° C., more preferably 100~200° C. The reaction time may vary depending on the size of the batch. For example, the reaction time for obtaining 10~30 g polyimide is 6~10 hours.

The organosilicon-modified polyimide can be classified as fluorinated aromatic organosilicon-modified polyimides and aliphatic organosilicon-modified polyimides. The fluorinated aromatic organosilicon-modified polyimides are synthesized from siloxane-type diamine, aromatic diamine comprising fluoro (F) group (or referred to as fluorinated aromatic diamine) and aromatic dianhydride comprising fluoro (F) group (or referred to as fluorinated aromatic anhydride). The aliphatic organosilicon-modified polyimides are synthesized from dianhydride, siloxane-type diamine and at least one diamine not comprising aromatic structure (e.g., benzene ring) (or referred to as aliphatic diamine), or from diamine (one of which is siloxane-type diamine) and at least one dianhydride not comprising aromatic structure (e.g., benzene ring) (or referred to as aliphatic anhydride). The aliphatic organosilicon-modified polyimide includes semi-aliphatic organosilicon-modified polyimide and fully aliphatic organosilicon-modified polyimide. The fully aliphatic organosilicon-modified polyimide is synthesized from at least one aliphatic dianhydride, siloxane-type diamine and at least one aliphatic diamine. The raw materials for synthesizing the semi-aliphatic organosilicon-modified polyimide include at least one aliphatic dianhydride or aliphatic diamine. The raw materials required for synthesizing the organosilicon-modified polyimide and the siloxane content in the organosilicon-modified polyimide would have certain effects on transparency, chromism, mechanical property, warpage extent and refractivity of the substrate.

[76] The organosilicon-modified polyimide of the present disclosure has a siloxane content of 20~75 wt %, preferably 30~70 wt %, and a glass transition temperature of below 150° C. The glass transition temperature (Tg) is determined on TMA-60 manufactured by Shimadzu Corporation after adding a thermal curing agent to the organosilicon-modified polyimide. The determination conditions include: load: 5 gram; heating rate: 10° C./min; determination environment: nitrogen atmosphere; nitrogen flow rate: 20 ml/min; temperature range: −40 to 300° C. When the siloxane content is below 20%, the film prepared from the organosilicon-modified polyimide resin composition may become very hard and brittle due to the filling of the phosphor and thermal conductive fillers, and tend to warp after drying and curing, and therefore has a low processability. In addition, its resistance to thermochromism becomes lower. On the other hand, when the siloxane content is above 75%, the film prepared from the organosilicon-modified polyimide resin composition becomes opaque, and has reduced transparency and tensile strength. Here, the siloxane content is the weight ratio of siloxane-type diamine(having a structure shown in formula (A)) to the organosilicon-modified polyimide, wherein the weight of the organosilicon-modified polyimide is the total weight of the diamine and the dianhydride used for synthesizing the organosilicon-modified polyimide subtracted by the weight of water produced during the synthesis.

Formula (A)

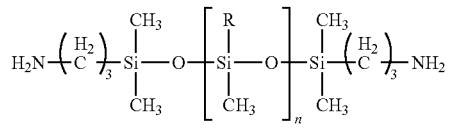

Wherein R is methyl or phenyl, preferably methyl, n is 1~5, preferably 1, 2, 3 or 5.

The present disclosure provides an organosilicon-modified polyimide resin composition comprising the above organosilicon-modified polyimide and a thermal curing agent, which may be epoxy resin, hydrogen isocyanate or bisoxazoline compound. In one embodiment, based on the weight of the organosilicon-modified polyimide, the amount of the thermal curing agent is 5~12% of the weight of the organosilicon-modified polyimide. The organosilicon-modified polyimide resin composition may further comprise heat dispersing particles and phosphor.

Light Transmittance

The factors affecting the light transmittance of the organosilicon-modified polyimide resin composition at least include the type of the main material, the type of the modifier(thermal curing agent), the type and content of the heat dispersing particles, and the siloxane content. Light transmittance refers to the transmittance of the light near the main light-emitting wavelength range of the LED chip. For example, blue LED chip has a main light-emitting wavelength of around 450 nm, then the composition or the polyimide should have low enough or even no absorption to the light having a wavelength around 450 nm, so as to ensure that most or even all the light can pass through the composition or the polyimide. In addition, when the light emitted by the LED chip passes through the interface of two materials, the closer the refractive indexes of the two materials, the higher the light output efficiency. In order to be close to the refractive index of the material (such as die bonding glue) contacting with the filament substrate (or base layer), the organosilicon-modified polyimide composition has a refractive index of 1.4~1.7, preferably 1.4~1.55. In order to use the organosilicon-modified polyimide resin composition as substrate in the filament, the organosilicon-modified polyimide resin composition is required to have good light transmittance at the peak wavelength of InGaN of the blue-excited white LED. In order to obtain a good transmittance, the raw materials for synthesizing the organosilicon-modified polyimide, the thermal curing agent and the heat dispersing particles can be adjusted. Because the phosphor in the organosilicon-modified polyimide resin composition may have certain effect on the transmittance test, the organosilicon-modified polyimide resin composition used for the transmittance test does not comprise phosphor. Such an organosilicon-modified polyimide resin composition has a transmittance of 86~93%, preferably 88~91%, or preferably 89~92%, or preferably 90~93%.

In the reaction of anhydride and diamine to produce polyimide, the anhydride and the diamine may vary. In other words, the polyimides produced from different anhydrides and different diamines may have different light transmittances. The aliphatic organosilicon-modified polyimide resin composition comprises the aliphatic organosilicon-modified polyimide and the thermal curing agent, while the fluorinated aromatic organosilicon-modified polyimide resin composition comprises the fluorinated aromatic organosilicon-modified polyimide and the thermal curing agent. Since the aliphatic organosilicon-modified polyimide has an alicyclic structure, the aliphatic organosilicon-modified polyimide resin composition has a relatively high light transmittance. In addition, the fluorinated aromatic, semi-aliphatic and full aliphatic polyimides all have good light transmittance in respect of the blue LED chips. The fluorinated aromatic organosilicon-modified polyimide is synthesized from a siloxane-type diamine, an aromatic diamine comprising a fluoro (F) group (or referred to as fluorinated aromatic diamine) and an aromatic dianhydride comprising a fluoro (F) group (or referred to as fluorinated aromatic anhydride). In other words, both $Ar^1$ and $Ar^2$ comprise a fluoro (F) group. The semi-aliphatic and full aliphatic organosilicon-modified polyimides are synthesized from a dianhydride, a siloxane-type diamine and at least one diamine not comprising an aromatic structure (e.g. a benzene ring) (or referred to as aliphatic diamine), or from a diamine (one of the diamine is siloxane-type diamine) and at least one dianhydride not comprising an aromatic structure (e.g. a benzene ring) (or referred to as aliphatic anhydride). In other words, at least one of $Ar^1$ and $Ar^2$ has an alicyclic hydrocarbon structure.

Although blue LED chips have a main light-emitting wavelength of 450 nm, they may still emit a minor light having a shorter wavelength of around 400 nm, due to the difference in the conditions during the manufacture of the chips and the effect of the environment. The fluorinated aromatic, semi-aliphatic and full aliphatic polyimides have different absorptions to the light having a shorter wavelength of 400 nm. The fluorinated aromatic polyimide has an absorbance of about 20% to the light having a shorter wavelength of around 400 nm, i.e. the light transmittance of the light having a wavelength of 400 nm is about 80% after passing through the fluorinated aromatic polyimide. The semi-aliphatic and full aliphatic polyimides have even lower absorbance to the light having a shorter wavelength of 400 nm than the fluorinated aromatic polyimide, which is only 12%. Accordingly, in an embodiment, if the LED chips used in the LED filament have a uniform quality, and emit less blue light having a shorter wavelength, the fluorinated aromatic organosilicon-modified polyimide may be used to produce the filament substrate or the light-conversion layer. In another embodiment, if the LED chips used in the LED filament have different qualities, and emit more blue light having a shorter wavelength, the semi-aliphatic or full aliphatic organosilicon-modified polyimides may be used to produce the filament substrate or the light-conversion layer.

Different heat dispersing particles would have different transmittances. If heat dispersing particles with low light transmittance or low light reflection are used, the light transmittance of the organosilicon-modified polyimide resin composition will be lower. The heat dispersing particles in the organosilicon-modified polyimide resin composition of the present disclosure are preferably selected to be transparent powders or particles with high light transmittance or high light reflection. Since the soft filament for the LED is mainly for the light emission, the filament substrate should have good light transmittance. In addition, when two or more types of heat dispersing particles are mixed, particles with high light transmittance and those with low light transmittance can be used in combination, wherein the proportion of particles with high light transmittance is higher than that of particles with low light transmittance. In an embodiment, for example, the weight ratio of particles with high light transmittance to particles with low light transmittance is 3~5:1.

Different siloxane content also affects the light transmittance. As can be seen from Table 1, when the siloxane content is only 37 wt %, the light transmittance is only 85%. When the siloxane content is increase to above 45%, the light transmittance exceeds 94%.

ingly, in an embodiment, if a high power, high brightness LED chip is used as the LED filament, the fluorinated aromatic organosilicon-modified polyimide may be used to produce the filament substrate or the light-conversion layer.

The siloxane content in the organosilicon-modified polyimide will affect the resistance to thermochromism of the organosilicon-modified polyimide resin composition. The resistance to thermochromism refers to the transmittance determined at 460 nm after placing the sample at 200° C. for 24 hours. As can be seen from Table 1, when the siloxane content is only 37 wt %, the light transmittance after 24 hours at 200° C. is only 83%. As the siloxane content is increased, the light transmittance after 24 hours at 200° C. increases gradually. When the siloxane content is 73 wt %, the light transmittance after 24 hours at 200° C. is still as high as 95%. Accordingly, increasing the siloxane content can effectively increase the resistance to thermochromism of the organosilicon-modified polyimide.

In the cross-linking reaction between the organosilicon-modified polyimide and the thermal curing agent, the thermal curing agent should have an organic group which is capable of reacting with the functional group having active hydrogen in the polyimide. The amount and the type of the thermal curing agent have certain effects on chromism, mechanical property and refractive index of the substrate. Accordingly, a thermal curing agent with good heat resistance and transmittance can be selected. Examples of the thermal curing agent include epoxy resin, isocyanate, bismaleimide, and bisoxazoline compounds. The epoxy resin may be bisphenol A epoxy resin, such as BPA; or siloxane-type epoxy resin, such as KF105, X22-163, and X22-163A; or alicylic epoxy resin, such as 3,4-epoxycyclohexylmethyl3,4-epoxycyclohexanecarboxylate (2021P), EHPE3150, and EHPE3150CE. Through the bridging reaction by the epoxy resin, a three dimensional bridge structure is formed between the organosilicon-modified polyimide and the epoxy resin, increasing the structural strength of the adhesive itself. In an embodiment, the amount of the thermal curing agent may be determined according to the molar amount of the thermal curing agent reacting with the func-

TABLE 1

| Organosilicon-Modified Polyimide | Siloxane Content (wt %) | Thermal Curing Agent | Tg (° C.) | Tensile Strength (MPa) | Elastic Modulus (GPa) | Elongation at Break (%) | Transmittance | Chemical Resistance | Resistance to Thermochromism |
|---|---|---|---|---|---|---|---|---|---|
| 1 | 37 | BPA | 158 | 33.2 | 1.7 | 10 | 85 | Δ | 83 |
| 2 | 41 | BPA | 142 | 38.0 | 1.4 | 12 | 92 | ○ | 90 |
| 3 | 45 | BPA | 145 | 24.2 | 1.1 | 15 | 97 | Δ | 90 |
| 4 | 64 | BPA | 30 | 8.9 | 0.04 | 232 | 94 | ○ | 92 |
| 5 | 73 | BPA | 0 | 1.8 | 0.001 | 291 | 96 | ○ | 95 |

Heat Resistance

The factors affecting the heat resistance of the organosilicon-modified polyimide resin composition include at least the type of the main material, the siloxane content, and the type and content of the modifier (thermal curing agent).

All the organosilicon-modified polyimide resin composition synthesized from fluorinated aromatic, semi-aliphatic and, full aliphatic organosilicon-modified polyimide have superior heat resistance, and are suitable for producing the filament substrate or the light-conversion layer. Detailed results from the accelerated heat resistance and aging tests (300° C.×1 hr) show that the fluorinated aromatic organosilicon-modified polyimide has better heat resistance than the aliphatic organosilicon-modified polyimide. Accordtional group having active hydrogen in the organosilicon-modified polyimide. In an embodiment, the molar amount of the functional group having active hydrogen reacting with the thermal curing agent is equal to that of the thermal curing agent. For example, when the molar amount of the functional group having active hydrogen reacting with the thermal curing agent is 1 mol, the molar amount of the thermal curing agent is 1 mol.

Thermal Conductivity

The factors affecting the thermal conductivity of the organosilicon-modified polyimide resin composition include at least the type and content of the phosphor, the type and content of the heat dispersing particles and the addition and the type of the coupling agent. In addition, the particle size and the particle size distribution of the heat dispersing particles would also affect the thermal conductivity.

The organosilicon-modified polyimide resin composition may also comprise phosphor for obtaining the desired light-emitting properties. The phosphor can convert the wavelength of the light emitted from the light-emitting semiconductor. For example, yellow phosphor can convert blue light to yellow light, and red phosphor can convert blue light to red light. Examples of yellow phosphor include transparent phosphor such as $(Ba,Sr,Ca)_2SiO_4$:Eu, and $(Sr,Ba)_2$ $SiO_4$:Eu(barium orthosilicate (BOS)); silicate-type phosphor having a silicate structure such as $Y_3Al_5O_{12}$:Ce(YAG(yttrium.aluminum.garnet):Ce), and $Tb_3Al_3O_{12}$:Ce(YAG (terbium.aluminum.garnet):Ce); and oxynitride phosphor such as Ca-α-SiAlON. Examples of red phosphor include nitride phosphor, such as $CaAlSiN_3$:Eu, and $CaSiN_2$:Eu. Examples of green phosphor include rare earth-halide phosphor, and silicate phosphor. The ratio of the phosphor in the organosilicon-modified polyimide resin composition may be determined arbitrarily according to the desired light-emitting property. In addition, since the phosphor have a thermal conductivity which is significantly higher than that of the organosilicon-modified polyimide resin, the thermal conductivity of the organosilicon-modified polyimide resin composition as a whole will increase as the ratio of the phosphor in the organosilicon-modified polyimide resin composition increases. Accordingly, in an embodiment, as long as the light-emitting property is fulfilled, the content of the phosphor can be suitably increased to increase the thermal conductivity of the organosilicon-modified polyimide resin composition, which is beneficial to the heat dissipation of the filament substrate or the light-conversion layer. Furthermore, when the organosilicon-modified polyimide resin composition is used as the filament substrate, the content, shape and particle size of the phosphor in the organosilicon-modified polyimide resin composition also have certain effect on the mechanical property (such as the elastic modulus, elongation, tensile strength) and the warpage extent of the substrate. In order to render superior mechanical property and thermal conductivity as well as small warpage extent to the substrate, the phosphor included in the organosilicon-modified polyimide resin composition are particulate, and the shape thereof may be sphere, plate or needle, preferably sphere. The maximum average length of the phosphor (the average particle size when they are spherical) is above 0.1 μm, preferably over 1 μm, further preferably 1~100 μm, and more preferably 1~50 μm. The content of phosphor is no less than 0.05 times, preferably no less than 0.1 times, and no more than 8 times, preferably no more than 7 times, the weight of the organosilicon-modified polyimide. For example, when the weight of the organosilicon-modified polyimide is 100 parts in weight, the content of the phosphor is no less than 5 parts in weight, preferably no less than 10 parts in weight, and no more than 800 parts in weight, preferably no more than 700 parts in weight. When the content of the phosphor in the organosilicon-modified polyimide resin composition exceeds 800 parts in weight, the mechanical property of the organosilicon-modified polyimide resin composition may not achieve the strength as required for a filament substrate, resulting in the increase of the defective rate of the product. In an embodiment, two kinds of phosphor are added at the same time. For example, when red phosphor and green phosphor are added at the same time, the added ratio of red phosphor to green phosphor is 1:5~8, preferably 1:6~7. In another embodiment, red phosphor and yellow phosphor are added at the same time, wherein the added ratio of red phosphor to yellow phosphor is 1:5~8, preferably 1:6~7. In another embodiment, three or more kinds of phosphor are added at the same time.

The main purposes of adding the heat dispersing particles are to increase the thermal conductivity of the organosilicon-modified polyimide resin composition, to maintain the color temperature of the light emission of the LED chip, and to prolong the service life of the LED chip. Examples of the heat dispersing particles include silica, alumina, magnesia, magnesium carbonate, aluminum nitride, boron nitride and diamond. Considering the dispersity, silica, alumina or combination thereof is preferably. The shape of the heat dispersing particles may be sphere, block, etc., where the sphere shape encompasses shapes which are similar to sphere. In an embodiment, heat dispersing particles may be in a shape of sphere or non-sphere, to ensure the dispersity of the heat dispersing particles and the thermal conductivity of the substrate, wherein the added weight ratio of the spherical and non-spherical heat dispersing particles is 1:0.1~50.35.

Table 2-1 shows the relationship between the content of the heat dispersing particles and the thermal conductivity of the organosilicon-modified polyimide resin composition. As the content of the heat dispersing particles increases, the thermal conductivity of the organosilicon-modified polyimide resin composition increases. However, when the content of the heat dispersing particles in the organosilicon-modified polyimide resin composition exceeds 1200 parts in weight, the mechanical property of the organosilicon-modified polyimide resin composition may not achieve the strength as required for a filament substrate, resulting in the increase of the defective rate of the product. In an embodiment, high content of heat dispersing particles with high light transmittance or high reflectivity (such as $SiO_2$, $Al_2O_3$) may be added, which, in addition to maintaining the transmittance of the organosilicon-modified polyimide resin composition, increases the heat dissipation of the organosilicon-modified polyimide resin composition. The heat conductivities shown in Tables 2-1 and 2-2 were measured by a thermal conductivity meter DRL-III manufactured by Xiangtan city instruments Co., Ltd. under the following test conditions: heating temperature: 90° C.; cooling temperature: 20° C.; load: 350N, after cutting the resultant organosilicon-modified polyimide resin composition into test pieces having a film thickness of 300 μm and a diameter of 30 mm.

TABLE 2-1

| Weight Ratio [wt %] | 0.0% | 37.9% | 59.8% | 69.8% | 77.6% | 83.9% | 89.0% |
|---|---|---|---|---|---|---|---|
| Volume Ratio [vol %] | 0.0% | 15.0% | 30.0% | 40.0% | 50.0% | 60.0% | 70.0% |
| Thermal Conductivity [W/m * K] | 0.17 | 0.20 | 0.38 | 0.54 | 0.61 | 0.74 | 0.81 |

TABLE 2-2

| | Specification | | | | | | |
|---|---|---|---|---|---|---|---|
| | 1 | 2 | 3 | 4 | 5 | 6 | 7 |
| Average Particle Size [μm] | 2.7 | 6.6 | 9.0 | 9.6 | 13 | 4.1 | 12 |
| Particle Size Distribution [μm] | 1~7 | 1~20 | 1~30 | 0.2~30 | 0.2~110 | 0.1~20 | 0.1~100 |
| Thermal Conductivity [W/m * K] | 1.65 | 1.48 | 1.52 | 1.86 | 1.68 | 1.87 | 2.10 |

Figure 5:
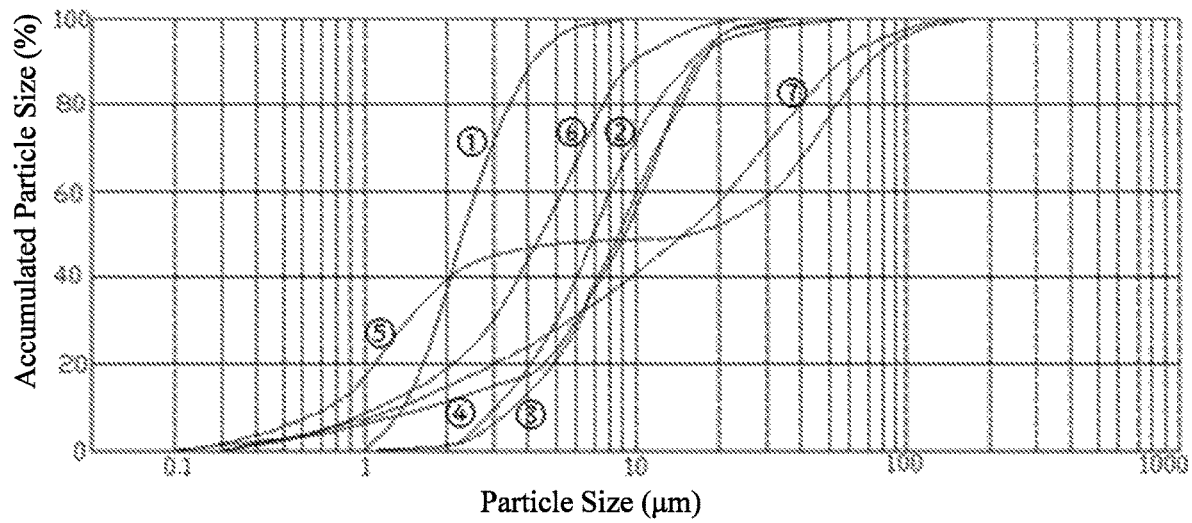
FIG. 5 shows the particle size distributions of the heat dispersing particles with different specifications.

For the effects of the particle size and the particle size distribution of the heat dispersing particles on the thermal conductivity of the organosilicon-modified polyimide resin composition, see both Table 2-2 and FIG. 5. Table 2-2 and FIG. 5 show seven heat dispersing particles with different specifications added into the organosilicon-modified polyimide resin composition in the same ratio and their effects on the thermal conductivity. The particle size of the heat dispersing particles suitable to be added to the organosilicon-modified polyimide resin composition can be roughly classified as small particle size (less than 1 μm), medium particle size (1-30 μm) and large particle size (above 30 μm).

Comparing specifications 1, 2 and 3, wherein only heat dispersing particles with medium particle size but different average particle sizes are added, when only heat dispersing particles with medium particle size are added, the average particle size of the heat dispersing particles does not significantly affect the thermal conductivity of the organosilicon-modified polyimide resin composition. Comparing specifications 3 and 4, wherein the average particle sizes are similar, the specification 4 comprising small particle size and medium particle size obviously exhibits higher thermal conductivity than specification 3 comprising only medium particle size. Comparing specifications 4 and 6, which comprise heat dispersing particles with both small particle size and medium particle size, although the average particle sizes of the heat dispersing particles are different, they have no significant effect on the thermal conductivity of the organosilicon-modified polyimide resin composition. Comparing specifications 4 and 7, specification 7, which comprises heat dispersing particles with large particle size in addition to small particle size and medium particle size, exhibits the most excellent thermal conductivity. Comparing specifications 5 and 7, which both comprise heat dispersing particles with large, medium and small particle sizes and have similar average particle sizes, the thermal conductivity of specification 7 is significant superior to that of specification 5 due to the difference in the particle size distribution. See FIG. 5 for the particle size distribution of specification 7, the curve is smooth, and the difference in the slope is small, showing that specification 7 not only comprises each particle size, but also have moderate proportions of each particle size, and the particle size is normally distributed. For example, the small particle size represents about 10%, the medium particle size represents about 60%, and the large particle size represents about 30%. In contrast, the curve for specification 5 has two regions with large slopes, which locate in the region of particle size 1-2 μm and particle size 30-70 μm, respectively, indicating that most of the particle size in specification 5 is distributed in particle size 1-2 μm and particle size 30-70 μm, and only small amount of heat dispersing particles with particle size 3-20 μm are present, i.e. exhibiting a two-sided distribution.

Accordingly, the extent of the particle size distribution of the heat dispersing particles affecting the thermal conductivity is greater than that of the average particle size of the heat dispersing particles. When large, medium and small particle sizes of the heat dispersing particles are added, and the small particle size represents about 5-20%, the medium particle size represents about 50-70%, and large particle size represents about 20-40%, the organosilicon-modified polyimide resin will have optimum thermal conductivity. That is because when large, medium and small particle sizes are present, there would be denser packing and contacting each other of heat dispersing particles in a same volume, so as to form an effective heat dissipating route.

In an embodiment, for example, alumina with a particle size distribution of 0.1~100 μm and an average particle size of 12 μm or with a particle size distribution of 0.1~20 μm and an average particle size of 4.1 μm is used, wherein the particle size distribution is the range of the particle size of alumina. In another embodiment, considering the smoothness of the substrate, the average particle size may be selected as ⅕~⅖, preferably ⅕~⅓ of the thickness of the substrate. The amount of the heat dispersing particles may be 1~12 times the weight (amount) of the organosilicon-modified polyimide. For example, if the amount of the organosilicon-modified polyimide is 100 parts in weight, the amount of the heat dispersing particles may be 100~1200 parts in weight, preferably 400~900 parts in weight. Two different heat dispersing particles such as silica and alumina may be added at the same time, wherein the weight ratio of alumina to silica may be 0.4~25:1, preferably 1~10:1.

In the synthesis of the organosilicon-modified polyimide resin composition, a coupling agent such as a silicone coupling agent may be added to improve the adhesion between the solid material (such as the phosphor and/or the heat dispersing particles) and the adhesive material (such as the organosilicon-modified polyimide), and to improve the dispersion uniformity of the whole solid materials, and to further improve the heat dissipation and the mechanical strength of the light-conversion layer. The coupling agent may also be titanate coupling agent, preferably epoxy titanate coupling agent. The amount of the coupling agent is related to the amount of the heat dispersing particles and the specific surface area thereof. The amount of the coupling agent=(the amount of the heat dispersing particles* the specific surface area of the heat dispersing particles)/the minimum coating area of the coupling agent. For example, when an epoxy titanate coupling agent is used, the amount of the coupling agent=(the amount of the heat dispersing particles* the specific surface area of the heat dispersing particles)/331.5.

Mechanical Strength

The factors affecting the mechanical strength of the organosilicon-modified polyimide resin composition include at least the type of the main material, the siloxane content, the type of the modifier (thermal curing agent), the phosphor and the content of the heat dispersing particles.

Different organosilicon-modified polyimide resins have different properties. Table 3 lists the main properties of the fluorinated aromatic, semi-aliphatic and full aliphatic organosilicon-modified polyimide, respectively, with a siloxane content of about 45% (wt %). The fluorinated aromatic has the best resistance to thermo chromism. The full aliphatic has the best light transmittance. The fluorinated aromatic has both high tensile strength and high elastic modulus. The conditions for testing the mechanical strengths shown in Table 3~5: the organosilicon-modified polyimide resin composition has a thickness of 50 μm and a width of 10 mm, and the tensile strength of the film is determined according to ISO527-3:1995 standard with a drawing speed of 10 mm/min.

modified polyimide resin composition is always less than 2.0 GPa, and as the siloxane content increases, the elastic modulus tends to decline, i.e. the organosilicon-modified polyimide resin composition tends to soften. However, where phosphor and alumina particles are added, the elastic modulus of the organosilicon-modified polyimide resin composition may be significantly increased, and is always higher than 2.0 GPa. Accordingly, the increase in the siloxane content may lead to softening of the organosilicon-

TABLE 3

| Organosilicon-Modified Polyimide | Siloxane Content (wt %) | Thermal Curing Agent | Tensile Strength (MPa) | Elastic Modulus (GPa) | Elongation at Break (%) | Transmittance | Resistance to Thermochromism |
|---|---|---|---|---|---|---|---|
| Fluorinated Aromatic | 44 | X22-163 | 22.4 | 1.0 | 83 | 96 | 95 |
| Semi-Aliphatic | 44 | X22-163 | 20.4 | 0.9 | 30 | 96 | 91 |
| Full Aliphatic | 47 | X22-163 | 19.8 | 0.8 | 14 | 98 | 88 |

TABLE 4

| Siloxane Content (wt %) | Addition of Phosphor, Alumina | Thermal Curing Agent | Tg (° C.) | Tensile Strength (MPa) | Elastic Modulus (GPa) | Elongation at Break (%) | Transmittance | Chemical Resistance | Resistance to Thermochromism |
|---|---|---|---|---|---|---|---|---|---|
| 37 | x | BPA | 158 | 33.2 | 1.7 | 10 | 85 | Δ | 83 |
| 37 | ○ | BPA | — | 26.3 | 5.1 | 0.7 | — | — | — |
| 41 | x | BPA | 142 | 38.0 | 1.4 | 12 | 92 | ○ | 90 |
| 41 | ○ | BPA | — | 19.8 | 4.8 | 0.8 | — | — | — |
| 45 | x | BPA | 145 | 24.2 | 1.1 | 15 | 97 | Δ | 90 |
| 45 | ○ | BPA | — | 21.5 | 4.2 | 0.9 | — | — | — |
| 64 | x | BPA | 30 | 8.9 | 0.04 | 232 | 94 | ○ | 92 |
| 64 | ○ | BPA | — | 12.3 | 3.1 | 1.6 | — | — | — |
| 73 | x | BPA | 0 | 1.8 | 0.001 | 291 | 96 | ○ | 95 |
| 73 | ○ | BPA | — | 9.6 | 2.5 | 2 | — | — | — |

TABLE 5

| Organosilicon-Modified Polyimide | Thermal Curing Agent | | Transmittance (%) | | | Film Thickness (μm) | Mechanical Strength | |
|---|---|---|---|---|---|---|---|---|
| | Type | Amount (%) | 380 nm | 410 nm | 450 nm | | Elongation (%) | Tensile Strength (MPa) |
| Full Aliphatic | BPA | 8.0 | 87.1 | 89.1 | 90.6 | 44 | 24.4 | 10.5 |
| Full Aliphatic | X22-163 | 8.0 | 86.6 | 88.6 | 90.2 | 40 | 43.4 | 8.0 |
| Full Aliphatic | KF105 | 12.0 | 87.5 | 89.2 | 90.8 | 43 | 80.8 | 7.5 |
| Full Aliphatic | EHPE3150 | 7.5 | 87.1 | 88.9 | 90.5 | 44 | 40.9 | 13.1 |
| Full Aliphatic | 2021p | 5.5 | 86.1 | 88.1 | 90.1 | 44 | 64.0 | 12.5 |

In the manufacture of the filament, the LED chip and the electrodes are first fixed on the filament substrate formed by the organosilicon-modified polyimide resin composition with a die bonding glue, followed by a wiring procedure, in which electric connections are established between adjacent LED chips and between the LED chip and the electrode with wires. To ensure the quality of die bonding and wiring, and to improve the product quality, the filament substrate should have a certain level of elastic modulus to resist the pressing force in the die bonding and wiring processes. Accordingly, the filament substrate should have an elastic modulus more than 2.0 GPa, preferably 2~6 GPa, more preferably 4~6 GPa. Table 4 shows the effects of different siloxane contents and the presence of particles (phosphor and alumina) on the elastic modulus of the organosilicon-modified polyimide resin composition. Where no fluorescent powder or alumina particle is added, the elastic modulus of the organosilicon-modified polyimide resin composition, which is advantageous for adding more fillers, such as more phosphor or heat dispersing particles. In order for the substrate to have superior elastic modulus and thermal conductivity, appropriate particle size distribution and mixing ratio may be selected so that the average particle size is within the range from 0.1 μm to 100 μm or from 1 μm to 50 μm.

In order for the LED filament to have good bending properties, the filament substrate should have an elongation at break of more than 0.5%, preferably 1~5%, most preferably 1.5~5%. As shown in Table 4, where no fluorescent powder or alumina particle is added, the organosilicon-modified polyimide resin composition has excellent elongation at break, and as the siloxane content increases, the elongation at break increases and the elastic modulus decreases, thereby reducing the occurrence of warpage. In contrast, where phosphor and alumina particles are added, the organosilicon-modified polyimide resin composition exhibits decreased elongation at break and increased elastic modulus, thereby increasing the occurrence of warpage.

By adding a thermal curing agent, not only the heat resistance and the glass transition temperature of the organosilicon-modified polyimide resin are increased, the mechanical properties, such as tensile strength, elastic modulus and elongation at break, of the organosilicon-modified polyimide are also increased. Adding different thermal curing agents may lead to different levels of improvement. Table 5 shows the tensile strength and the elongation at break of the organosilicon-modified polyimide resin composition after the addition of different thermal curing agents. For the full aliphatic organosilicon-modified polyimide, the addition of the thermal curing agent EHPE3150 leads to good tensile strength, while the addition of the thermal curing agent KF105 leads to good elongation.

TABLE 6

Specific Information of BPA

| Product Name | Viscosity at 25° C.(mPa · s) | Color (G) | Content of Hydrolysable Chlorine (mg/kg) | Equivalent of Epoxy (g/mol) | Hue APHA |
|---|---|---|---|---|---|
| BPA | 11000~15000 | ≤1 | ≤300 | 184~194 | ≤30 |

TABLE 7

Specific Information of 2021P

| Product Name | Viscosity at 25° C. (mPa · s) | Specific Gravity (25/25° C.) | Melting Point (° C.) | Boiling Point (° C./4 hPa) | Water Content (%) | Equivalent of Epoxy (g/mol) | Hue APHA |
|---|---|---|---|---|---|---|---|
| 2021P | 250 | 1.17 | −20 | 188 | 0.01 | 130 | 10 |

TABLE 8

Specific Information of EHPE3150 and EHPE3150CE

| Product Name | Viscosity at 25° C. (mPa · s) | Appearance | Softening Point | Equivalent of Epoxy (g/mol) | Hue APHA |
|---|---|---|---|---|---|
| EHPE3150 | — | Transparent Plate Solid | 75 | 177 | 20 (in 25% acetone solution) |
| EHPE3150CE | 50,000 | Light Yellow Transparent Liquid | — | 151 | 60 |

TABLE 9

Specific Information of PAME, KF8010, X22-161A, X22-161B, NH15D, X22-163, X22-163A and KF-105

| Product Name | Viscosity at 25° C.(mm²/s) | Specific Gravity at 25° C. | Refractive Index at 25° C. | Equivalent of Functional Group |
|---|---|---|---|---|
| PAME | 4 | 0.90 | 1.448 | 130 g/mol |
| KF8010 | 12 | 1.00 | 1.418 | 430 g/mol |
| X22-161A | 25 | 0.97 | 1.411 | 800 g/mol |
| X22-161B | 55 | 0.97 | 1.408 | 1500 g/mol |
| NH15D | 13 | 0.95 | 1.403 | 1.6~2.1 g/mmol |
| X22-163 | 15 | 1.00 | 1.450 | 200 g/mol |
| X22-163A | 30 | 0.98 | 1.413 | 1000 g/mol |
| KF-105 | 15 | 0.99 | 1.422 | 490 g/mol |

A film (composite film) with high thermal conductivity can be obtained from the above organosilicon-modified polyimide resin composition by coating and then drying and curing, so as to achieve any one or combination of the following properties: superior light transmittance, chemical resistance, heat resistance, thermal conductivity, film mechanical property and light resistance. The temperature and time in the drying and curing step may be suitably selected according to the solvent and the coated film thickness of the organosilicon-modified polyimide resin composition. The weight change of the organosilicon-modified polyimide resin composition before and after the drying and curing as well as the change in the peaks in the IR spectrum representing the functional groups in the thermal curing agent can be used to determine whether the drying and curing are completed. For example, when an epoxy resin is used as the thermal curing agent, whether the difference in the weight of the organosilicon-modified polyimide resin composition before and after the drying and curing is equal to the weight of the added solvent as well as the increase or decrease of the epoxy peak before and after the drying and curing are used to determine whether the drying and curing are completed.

When the organosilicon-modified polyimide resin composition composite film is used as the filament substrate (or base layer), the LED chip is a hexahedral luminous body. In the production of the LED filament, at least two sides of the LED chip are coated by a top layer. When the prior art LED filament is lit up, non-uniform color temperatures in the top layer and the base layer would occur, or the base layer would give a granular sense. Accordingly, as a filament substrate, the composite film is required to have superior transparency. In other embodiments, sulfonyl group, non-coplanar structure, meta-substituted diamine, or the like may be introduced into the backbone of the organosilicon-modified polyimide to improve the transparency of the organosilicon-modified polyimide resin composition. In addition, in order for the bulb employing said filament to achieve omnidirectional illumination, the composite film as the substrate should have certain flexibility.

The LED filament structure in the aforementioned embodiments is mainly applicable to the LED light bulb product, so that the LED light bulb can achieve the omnidirectional light illuminating effect through the flexible bending characteristics of the single LED filament. The specific embodiment in which the aforementioned LED filament applied to the LED light bulb is further explained below.

Figure 6:
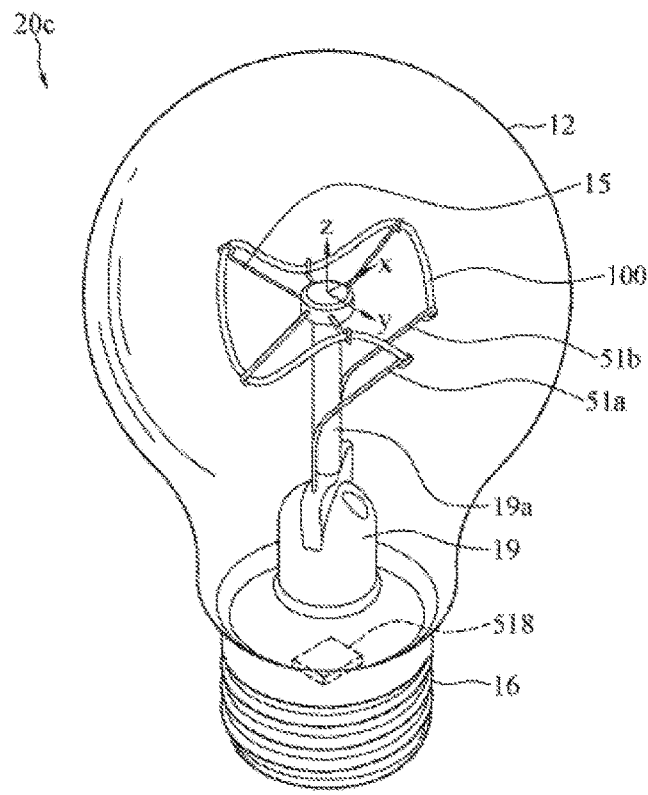
FIG. 6 illustrates a perspective view of an LED light bulb according to an embodiment of the instant disclosure.

Please refer to FIG. 6. FIG. 6 illustrates a perspective view of an LED light bulb according to the third embodiment of the present disclosure. According to the third embodiment, the LED light bulb 20c comprises a lamp housing 12, a bulb base 16 connected with the lamp housing 12, two conductive supports 51a, 51b disposed in the lamp housing 12, a driving circuit 518 electrically connected with both the conductive supports 51a, 51b and the bulb base 16, a stem 19, supporting arms 15 and a single LED filament 100.

The lamp housing 12 is a material which is preferably light transmissive or thermally conductive, such as, glass or plastic, but not limited thereto. In implementation, the lamp housing 12 may be doped with a golden yellow material or its surface coated with a yellow film to absorb a portion of the blue light emitted by the LED chip to reduce the color temperature of the light emitted by the LED light bulb 20c. In other embodiments of the present invention, the lamp housing 12 includes a layer of luminescent material (not shown), which may be formed on the inner surface or the outer surface of the lamp housing 12 according to design requirements or process feasibility, or even integrated in the material of the lamp housing 12. The luminescent material layer comprises low reabsorption semiconductor nanocrystals (hereinafter referred to as quantum dots), the quantum dots comprises a core, a protective shell and a light absorbing shell, and the light absorbing shell is disposed between the core and the protective shell. The core emits the emissive light with emission wavelength, and the light absorbing shell emits the excited light with excitation wavelength. The emission wavelength is longer than the excitation wavelength, and the protective shell provides the stability of the light.

Each of the supporting arms 15 comprises a first end and a second end opposite to the first end of the supporting arms 15, the stem 19 has a stand 19a extending to the center of the lamp housing 12. The stand 19a supports the supporting arms 15. The first end of each of the supporting arms 15 is connected with the stand 19a while the second end of each of the supporting arms 15 is connected with the LED filament 100.

The supporting arms 15 may be, but not limited to, made of carbon steel spring to provide with adequate rigidity and flexibility so that the shock to the LED light bulb caused by external vibrations is absorbed and the LED filament 100 is not easily to be deformed. Since the stand 19a extending to the center of the lamp housing 12 and the supporting arms 15 are connected to a portion of the stand 19a near the top thereof, the position of the LED filaments 100 is at the level close to the center of the lamp housing 12. Accordingly, the illumination characteristics of the LED light bulb 20c are close to that of the traditional light bulb including illumination brightness. The illumination uniformity of LED light bulb 20c is better. In the embodiment, at least a half of the LED filaments 100 is around a center axle of the LED light bulb 20c. The center axle is coaxial with the axle of the stand 19a.

In the embodiment, the first end of the supporting arm 15 is connected with the stand 19a of the stem 19. In an embodiment where the stem 19 is made of glass, the stem 19 would not be cracked or exploded because of the thermal expansion of the supporting arms 15 of the LED light bulb 20c. Additionally, there may be no stand in an LED light bulb. The supporting arm 15 may be fixed to the stem or the lamp housing directly to eliminate the negative effect to illumination caused by the stand.

The supporting arm 15 is thus non-conductive to avoid a risk that the glass stem 19 may crack due to the thermal expansion and contraction of the metal filament in the supporting arm 15 under the circumstances that the supporting arm 15 is conductive and generates heat when current passes through the supporting arm 15.

In different embodiments, the second end of the supporting arm 15 may be directly inserted inside the LED filament 100 and become an auxiliary piece in the LED filament 100, which can enhance the mechanical strength of the LED filament 100.

The LED filament 100 shown in FIG. 6 is curved to form a circular shape in a top view while the LED filament is curved to form a wave shape in a side view. The wave shaped structure is not only novel in appearance but also guarantees that the LED filament 100 illuminates evenly. In the meantime, the single LED filament 100, comparing to multiple LED filaments, requires less joint points (e.g., pressing points, fusing points, or welding points) for being connected to the conductive supports 51a, 51b. In practice, the single LED filament 100 (as shown in FIG. 6) requires only two joint points respectively formed on the two conductive electrodes, which effectively lowers the risk of fault welding and simplifies the process of connection comparing to the mechanically connection in the tightly pressing manner.

In an embodiment, the LED light bulb 20c shown in FIG. 6 may be a light bulb with an A size. The two joint points for electrical connection between the two conductive supports 51a, 51b and the LED filament 100 is spaced by a distance, which is within 3 cm and is preferably within 2 cm. The LED filament 100 surrounds with the wave shape; therefore, the LED filament 100 may generate an effect of an omnidirectional light, and the two joint points may be close to each other such that the conductive supports 51a, 51b are substantially below the LED filament 100. Visually, the conductive supports 51a, 51b keeps a low profile and is integrated with the LED filament 100 to show an elegance curvature. While being observed from a side of the LED filament 100 in the LED light bulb 20c, a distance between the highest point and the lowest point of the wave of the LED filament 100 is from 2.2 cm to 3.8 cm and is preferably from 2.2 cm to 2.8 cm. Thus it could be ensured that there would be a space for heat dissipation above the LED filament 100.

As shown in FIG. 6, the shape of the LED filament 100 may satisfy a curve equation. The position of the LED filament 100 in space relates to the Cartesian coordinates (i.e., an xyz coordinates) shown in FIG. 6. An x-y plane of the xyz coordinates is a plane passing through a top of the stem 19 (i.e., a top of the stand 19a in the embodiment in which the stand 19a is deemed as a part of the stem 19). An origin of the xyz coordinates is at the top of the stem 19 (the origin may be at a center of a sphere body of a lamp housing of a light bulb without any stems). The x-y plane is perpendicular to a height direction of the LED light bulb 20c.

The two conductive electrodes (i.e., the welding points, the joint points, the contacting points, or the fusing points) are symmetrically disposed at two sides of a y-axis of the xyz coordinates. A z-axis of the xyz coordinates is coaxial with stem 19 (or is coaxial with a central axis passing through a horizontal plane of the LED light bulb 20c). The shape of the LED filament 100 varies along an x-direction, a y-direction, and a z-direction according to t, and t is a variable between 0 and 1. A position of points of the LED filament 100 in the xyz coordinates is defined as X, Y, and Z and satisfies the curve equation. Herein, the term "points of the LED filament" means "most of points of the LED filament", or "more than 60% of points of the LED filament." The curve equation is:

$$X=m1*\cos(t*360),$$

$$Y=m2*\sin(t*360),$$

$$Z=n*\cos(t*360*k),$$

The LED filament 100 varies along the x-direction, the y-direction, and the z-direction according to t. When X=0, |Y|max=m2 (a max value of |Y| is m2), and |Z|max=n (a max value of |Z| is n). When Y=0, |X|max=m1 (a max value of |X| is m1), and |Z|max=n (the max value of |Z| is n). When Z=0, |X|max=m1 (the max value of |X| is m1), and |Y|max=m2 (the max value of |Y| is m2). m1 is a length (projection length) in the x-direction, and 24≤m1≤27 (mm). m2 is a length (projection length) in the y-direction, and 24≤m2≤27 (mm). Based upon the above configuration, the LED filament 100 in the lamp housing 12 may provide good luminous flux. n is a height of the highest point of the LED filament 100 from the x-y plane in the z-direction, and 0<n≤14 (mm). Based upon the above condition, wires in turning points of the LED filament 100 may hard to break. k is a number of the highest point(s). The more the supporting arms (or supporting bars), the hard the manufacture is; therefore, k is configured as: 2≤k≤8. A curve line drawn by the above curve equation may be deemed as a reference for the LED filament 100 being distributed in space. According to conditions of different arts and equipment, the configuration of the LED filament 100 in practice may have about 0 to 25% in spatial difference different from the reference based upon the curve equation. Certain region(s) on the filament with supporting point(s) may be relatively highest point(s) and lowest point(s). The spatial difference of the certain region(s) may be less, e.g., 0 to 20%. In an embodiment, r is the radius of a cross section of the lamp housing on the horizontal plane. Cross sections of the lamp housing on the horizontal plane from the bottom to the top of the lamp housing along the height direction may have varied radii, and the radius r is the one with the largest value. In such case, the values of m1, m2, and n may be set as: 0.8*r≤m1≤0.9*r; 0.8*r≤m2≤0.9*r; 0<n≤0.47*r. Additionally, p is the radius of an interface of the bulb base utilized for being connected to the lamp housing, G is the length of the LED filament, and, in such case, the values of G may be set as: 1.2*p≤G≤5.6*r. Based upon the above setting, the LED filament may not only achieve the aforementioned effect, but may also need the least length and the least number of the LED chips. As a result, the cost of materials for the manufacture of the LED light bulb may reduce, and the temperature of the LED light bulb during operation can be suppressed.

The meaning of the term "a single LED filament" and "a single strip LED filament" as used in the present invention is mainly composed of the aforementioned conductive section, the LED section, the connection between thereof, the light conversion layer (including the consecutive top layer or the bottom layer, with continuous formation to cover or support all the components), and two conductive electrodes electrically connected to the conductive brackets of the LED light bulb disposing at both ends of the LED filament, which is the single LED filament structure referred to in the present invention.

Figure 7A:
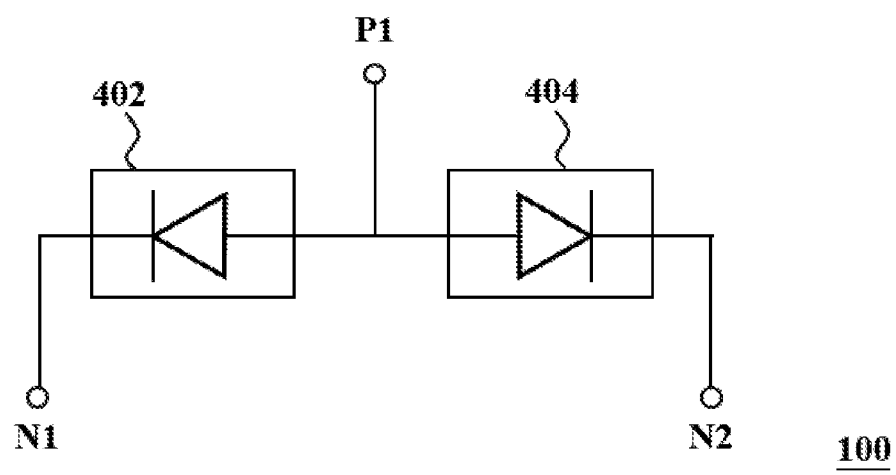
FIGS. 7A to 7C are schematic circuit diagrams of an LED filament in accordance with an embodiment of the present invention.

In some embodiments, LED filament 100 may have multiple LED sections. At least part or all of LED chips on a single LED section are electrically connected in series. Different LED sections are electrically connected in parallel. Anode and cathode of each LED section may serve as a positive electrode and negative electrodes of the LED filament, respectively. The negative electrodes separately connect with two or more of the conductive supports (e.g., conductive supports Ma, 51*b* in FIG. 6) and finally connect to a power module (such as power module 518 in FIG. 6). As shown in FIG. 7A, which is a schematic circuit diagram of the LED filament according to some embodiments of the present invention, LED filament 100 in this embodiment has two LED sections 402, 404. Each LED section 402, 404 includes one or more LED chips. LED chips in a single LED section are electrically connected in series. Two LED sections 402, 404 have respective current paths after they have been electrically electrically connected (i.e. in parallel). In detail, in this embodiment, anodes of LED sections 402, 404 are electrically connected together to serve as a positive electrode P1 of LED filament 100. Cathodes of LED section 402 and 404 serve as a first negative electrode N1 and a second negative electrode N2, respectively. Positive electrode P1, first negative electrode N1 and second negative electrode N2 are separately electrically connected to the power module through conductive supports such as conductive supports 51*a*, 51*b* and power module 518 shown in FIG. 6.

Figure 7B:
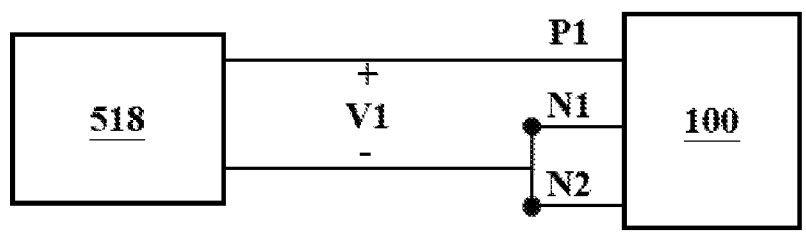
Figure 7C:
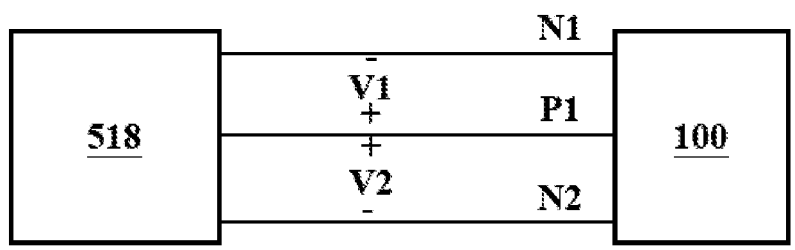

In more detail, the connection relationship between positive electrode P1, first negative electrode N1 and second negative electrode N2 may be shown as FIG. 7B or FIG. 7C, in which FIGS. 7B and 7C are two schematic views of electrical connections of the LED filament according to some embodiments of the present invention. Please refer to FIG. 7B first. In this embodiment, positive electrode P1 of LED filament 100 is electrically electrically connected to a first output terminal (also called "positive output terminal) of power module 518. First and second negative electrodes N1, N2 of LED filament 100 are electrically electrically connected together and then jointly electrically connected to a second output terminal (also called "negative output terminal") of power module 518. Further refer to FIG. 7A, under the electrical relationship shown in FIG. 7B, LED sections 402, 404 can be deemed as being electrically connected to the output terminals of power module 518 in parallel. Thus, all LED sections 402, 404 are driven by driving voltage V1 between the first and second output terminals. Under a precondition of LED sections 402, 404 having identical or similar chips number and arrangement, the driving current from power module 518 will evenly dividedly flow to each of LED sections 402, 404. As a result, LED sections 402, 404 can present approximately even intensity and/or color temperature.

Please further refer to FIG. 7C. In this embodiment, positive electrode P1 of LED filament 100 is electrically connected to the first output terminal of power module 518, first negative electrode N1 of LED filament 100 is electrically connected to the second output terminal (also called "first negative output terminal") of power module 518, and the second negative electrode N2 of LED filament 100 is electrically connected to the third output terminal (also called "second negative output terminal") of power module 518. Driving voltage V1 is formed between the first output terminal and the second output terminal of power module 518, and another driving voltage V2 is formed between the first output terminal and the third output terminal of power module 518. Referring to FIG. 7A together, under the electrical relationship shown in FIG. 7C, LED section 402 is electrically connected between the first output terminal and the second output terminal, and LED section 404 is electrically connected between the first output terminal and the third output terminal. As a result, LED sections 402 and 404 can be deemed as being driven by driving voltages V1, and V2, respectively. In such an arrangement, the driving currents provided by power module 518 to LED sections 402, 404 can be independently controlled by adjusting output voltages V1 and V2, so as to make LED sections 402, 404 separately generate corresponding intensity and/or color temperature. In other words, dimming the different LED sections individually on a single LED filament can be implemented by design and control of the power module based on the arrangement of FIG. 7C.

In some embodiments, the second and third output terminals of power module 518 can be electrically connected together through a resistor, and either of the second and third output terminals of the power module 518 is electrically connected to a ground terminal. By this arrangement, negative output terminals with different levels can be obtained to generate two different driving voltages V1 and V2. In some embodiments, levels of the second and third output terminals can be controlled by a circuit. The present invention is not limited thereto.

Figure 8A:
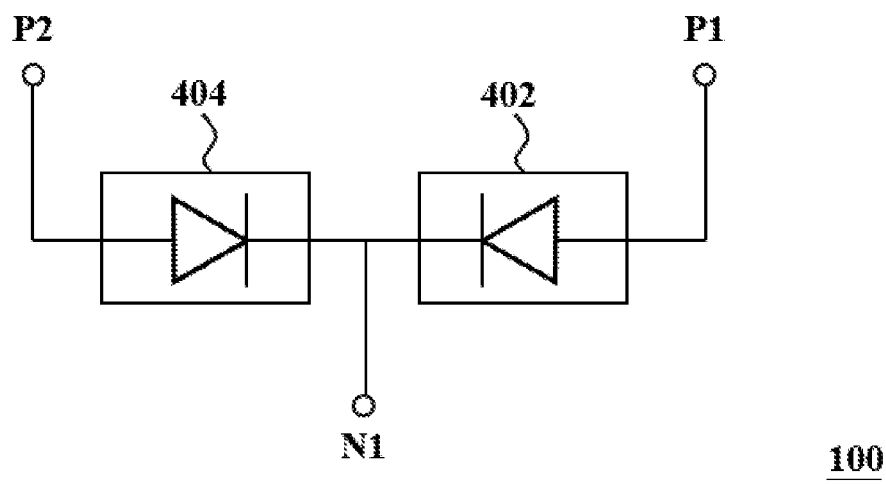
FIGS. 8A to 8C are schematic circuit diagrams of an LED filament in accordance with another embodiment of the present invention.

FIG. 8A is a schematic circuit diagram of the LED filament according to some embodiments of the present invention. In this embodiment, LED filament 100, which is similar to the one shown in FIG. 7A, has two LED sections 402, 404, and thus the details of the LED sections 402, 404 will not be repeated herein. A main difference between this embodiment and the embodiment shown in FIG. 7A is that cathodes of LED sections 402, 404 of this embodiment are electrically connected together to serve as negative electrode N1 of the LED filament, and anodes of LED sections 402, 404 serve as first positive electrode P1 and second positive electrode P2 of LED filament 100, respectively. Negative electrode N1, first positive electrode P1 and second positive electrode P2 of LED filament 100 are electrically connected to the power module through conductive supports, such as conductive supports 51*a*, 51*b* and power module 518 shown in FIG. 6.

Figure 8B:
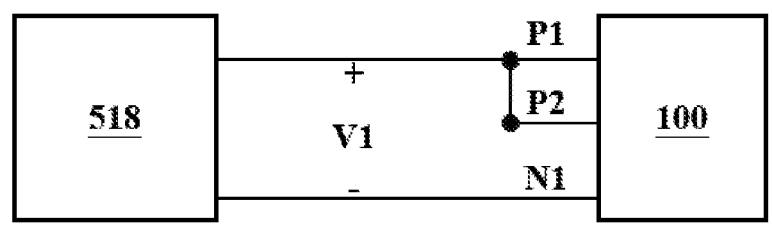
Figure 8C:
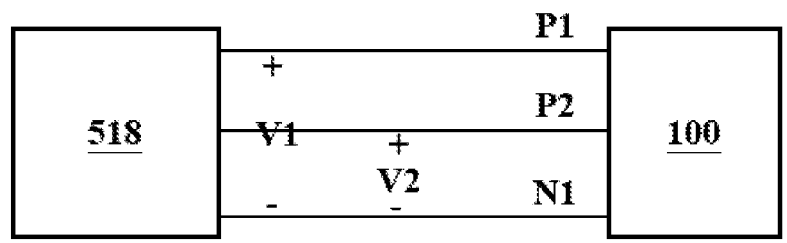

The electrical relationship between negative electrode N1, first positive electrode P1 and second positive electrode P2 of LED filament 100 and the power module may be shown in FIG. 8B or 8C. FIGS. 8B and 8C are two schematic views of electrical connections of the LED filament according to two different embodiments. Please refer to FIG. 8B first. In this embodiment, a first positive electrode P1 and a second positive electrode P2 of LED filament 100 are electrically electrically connected together and jointly electrically connected to a first output terminal (also called "positive output terminal) of power module 518. Negative electrode N1 of LED filament 100 is electrically electrically connected to a second output terminal (also called "negative output terminal") of power module 518. Further refer to FIG. 8A, under the electrical relationship shown in FIG. 8B, LED sections 402, 404 can be deemed as being electrically connected to the output terminals of power module 518 in parallel. Thus, all LED sections 402, 404 are driven by driving voltage V1 between the first and second output terminals. Under a precondition of LED sections 402, 404 having identical or similar chips number and arrangement, the driving current from power module 518 will evenly dividedly flow to each of LED sections 402, 404. As a result, LED sections 402, 404 can present approximately even intensity and/or color temperature. This arrangement is equivalent to that of the embodiment shown in FIG. 7B.

Please further refer to FIG. 8C. In this embodiment, positive electrode P1 of LED filament 100 is electrically connected to the first output terminal of power module 518, second positive electrode P2 of LED filament 100 is electrically connected to the second output terminal (also called "second positive output terminal") of power module 518, and negative electrode N1 of LED filament 100 is electrically connected to the third output terminal (also called "negative output terminal") of power module 518. Driving voltage V1 is formed between the first output terminal and the third output terminal of power module 518, and another driving voltage V2 is formed between the second output terminal and the third output terminal of power module 518. Please further refer to FIG. 8A. Under the electrical relationship shown in FIG. 8C, LED section 402 is electrically connected between the first output terminal and the third output terminal, and LED section 404 is electrically connected between the second output terminal and the third output terminal. As a result, LED sections 402 and 404 can be deemed as being driven by driving voltages V1, and V2, respectively. In such an arrangement, the driving currents provided by power module 518 to LED sections 402, 404 can be independently controlled by adjusting output voltages V2, V2 so as to make LED sections 402, 404 separately generate corresponding intensity and/or color temperature. In other words, in the arrangement of FIG. 8C, a dimming function can be implemented to a single LED filament by design and control of the power module.

The various embodiments of the present invention described above may be arbitrarily combined and transformed without being mutually exclusive, and are not limited to a specific embodiment. For example, some features as described in the embodiment shown in FIG. C although not described in the embodiment shown in FIG. A, those features may be included in the embodiment of FIG. A. That is, those skilled in the art can applies some features of the FIG. A to the embodiment shown in the FIG. C without additional creativity. Or alternatively, although the invention has illustrated various creation schemes by taking the LED light bulb as an example, it is obvious that these designs can be applied to other shapes or types of light bulb without additional creativity, such as LED candle bulbs, and the like.

The invention has been described above in terms of the embodiments, and it should be understood by those skilled in the art that the present invention is not intended to limit the scope of the invention. It should be noted that variations and permutations equivalent to those of the embodiments are intended to be within the scope of the present invention. Therefore, the scope of the invention is defined by the scope of the appended claims.

What is claimed is:

1. An LED filament light bulb, comprising:
   a lamp housing with inner surface and outer surface opposite to the inner surface of the lamp housing, the lamp housing includes a layer of luminescent material which is formed on the inner surface or the outer surface of the lamp housing or integrated in a material of the lamp housing;
   a bulb base connected to the lamp housing;
   a stem connected to the bulb base and located in the lamp housing; and
   a single LED filament, disposed in the light housing, the single LED filament comprising:
   a plurality of LED filament units, wherein each of the plurality of LED filament units includes a single LED chip with an upper surface and a lower surface opposite to the upper surface of the single LED chip; and a light conversion layer comprising a top layer and a base layer, wherein the base layer comprises an upper surface and a lower surface opposite to the upper surface of the base layer, the top layer with an upper surface and a lower surface opposite to the upper surface of the top layer is disposed on at least two sides of each of the single LED chip, the lower surface of each of the single LED chip is close to the upper surface of the base layer, the upper surface of the top layer is away from each of the single LED chip;

wherein C represents the length of the each of the plurality of LED filament unit in the longitudinal direction of the single LED filament, and C is between f and 4H tan 0.5α, where f represents the maximum value of both 0.2H tan 0.5α and 0.1W1 tan 0.5α/tan 0.5β, and H represents the distance from the upper surface of each of the single LED chip to the upper surface of the top layer, where α represents the illumination angle of each of the single LED chip in the longitudinal direction of the single LED filament, and W1 represents the width of the upper surface of the base layer or the width of the lower surface of the top layer in the short axial direction of the single LED filament; where β represents the illumination angle of each of the single LED chip in the short axial direction of the single LED filament;

wherein the base layer of the light conversion layer is formed from organosilicon-modified polyimide resin composition comprising an organosilicon-modified polyimide and a thermal curing agent, wherein the organosilicon-modified polyimide comprises a repeating unit represented by the following general formula (I):

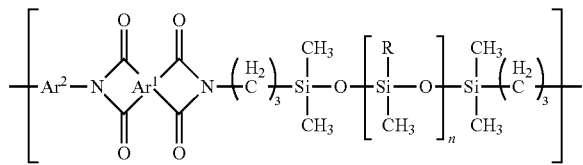

wherein $Ar^1$ is a tetra-valent organic group having a benzene ring or an alicyclic hydrocarbon structure, $Ar^2$ is a di-valent organic group having a monocyclic alicyclic hydrocarbon structure, R is each independently methyl or phenyl, n is 1-5;

wherein the organosilicon-modified polyimide has a number average molecular weight of 5000-100000; and wherein the thermal curing agent is selected from the group consisting of epoxy resin, isocyanate and bisoxazoline compounds.

2. The LED filament light bulb of claim 1, wherein C is between F and 2H tan 0.5α, where F represents the maximum value of both H tan 0.5α and 0.1W1 tan 0.5α/tan 0.5β.

3. The LED filament light bulb of claim 1, wherein C is between g and 6.92H, where g represents the maximum value of 0.34H and 0.1W1.

4. The LED filament light bulb of claim 1, wherein C is between G and 3.46H, where G represents the maximum value of 1.73H and 0.1W1.

5. The LED filament light bulb of claim 4, wherein the proportion of W1 and W2 is W1: W2=1:0.8-1:0.9, where W2 represent the width of each of the single LED chip in the short axial direction of the single LED filament.

6. The LED filament light bulb of claim 5, wherein the luminescent material layer comprises quantum dots, the quantum dots comprises a core, a protective shell and a light absorbing shell, and the light absorbing shell is disposed between the core and the protective shell.

7. The LED filament light bulb of claim 5, further comprising a plurality of supporting arms connected with and supporting the single LED filament, wherein the stem comprises a stand extending to the center of the lamp housing, the stand supports the supporting arms.

8. The LED filament light bulb of claim 7, wherein each of the supporting arms comprises a first end and a second end opposite to the first end of the supporting arms, the first end of each of the supporting arms is connected with stand while the second end of the supporting arms is connected with the single LED filament.

9. The LED filament light bulb of claim 8, wherein $Ar^1$ is a tetra-valent organic group having a benzene ring or an alicyclic hydrocarbon structure comprising a functional group having active hydrogen, and $Ar^2$ is a di-valent organic group comprising a functional group having active hydrogen.

10. The LED filament light bulb of claim 9, wherein the functional group having active hydrogen is any one of hydroxyl, amino, carboxy and mercapto.

11. The LED filament light bulb of claim 10, wherein $Ar^1$ is derived from a dianhydride, and $Ar^2$ is derived from a diamine.

12. The LED filament light bulb of claim 11, wherein the amount of the thermal curing agent is 5-2% of the weight of the organosilicon-modified polyimide.

13. The LED filament light bulb of claim 12, wherein the organosilicon-modified polyimide resin composition has a transmittance of 89-92%.

14. The LED filament light bulb of claim 13, wherein the molar ratio of the thermal curing agent to the functional group having active hydrogen in the organosilicon-modified polyimide is 1:1.

15. The LED filament light bulb of claim 14, wherein the organosilicon-modified polyimide resin composition further comprises an additive which is selected from the group consisting of fluorescent powders, heat dispersing particles and a coupling agent.

16. The LED filament light bulb of claim 15, wherein the heat dispersing particles have a particle size distribution of 0.1-100 μm.

17. The LED filament light bulb of claim 16, wherein the content of the heating dispersing particles having small particle size of below 1 μm is 5-20%, the content of medium particle size of 1-30 μm is 50-70%, and the content of large particle size of above 30 μm is 20-40%.

18. The LED filament light bulb of claim 17, wherein the weight ratio of the fluorescent powders to the organosilicon-modified polyimide is 50-800:100.

19. The LED filament light bulb of claim 18, wherein the base layer has an elastic modulus of more than 2.0 GPa, and an elongation at break of more than 0.5%.

20. The LED filament light bulb of claim 19, wherein points of the LED filament in an xyz coordinates are defined as X, Y, and Z and satisfy a curve equation, an origin of xyz coordinates is at the stem top, an x-y plane of the xyz coordinates passes through the stem top and is perpendicular to the height direction, a z-axis of xyz coordinates is coaxial with stem, and the two conductive electrodes are symmetrically disposed at two sides of a y-axis of the xyz coordinates, the curve equation is:

$$X = m1 * \cos(t * 360),$$

$$Y = m2 * \sin(t * 360),$$

$$Z = n * \cos(t * 360 * k),$$

Wherein, t is a variable between 0 and 1, the LED filament varies along an x-direction, a y-direction, and a z-direction according to t; wherein, when X=0, a max value of |Y| is m2, and a max value of |Z| is n; wherein, when Y=0, a max value of |X| is m1, and a max value of |Z| is n; wherein, when Z=0, a max value of |X| is m1, and a max value of |Y| is m2; wherein m1 is a length in the x-direction, m2 is a length in the y-direction, n is a height of the highest point from the x-y plane in the z-direction, and k is a number of the highest point.

* * * * *